US011962902B2

(12) United States Patent
Nakata

(10) Patent No.: US 11,962,902 B2
(45) Date of Patent: *Apr. 16, 2024

(54) IMAGE SENSOR AND ELECTRONIC APPARATUS

(71) Applicant: SONY GROUP CORPORATION, Tokyo (JP)

(72) Inventor: Masashi Nakata, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/185,942

(22) Filed: Mar. 17, 2023

(65) Prior Publication Data
US 2023/0232100 A1 Jul. 20, 2023

Related U.S. Application Data

(63) Continuation of application No. 17/307,548, filed on May 4, 2021, now Pat. No. 11,641,521, which is a
(Continued)

(30) Foreign Application Priority Data

Mar. 25, 2013 (JP) ................. 2013-061952

(51) Int. Cl.
*G03B 13/36* (2021.01)
*G02B 7/34* (2021.01)
(Continued)

(52) U.S. Cl.
CPC ............. *H04N 23/672* (2023.01); *G02B 7/34* (2013.01); *G03B 13/36* (2013.01);
(Continued)

(58) Field of Classification Search
CPC ....... H04N 5/23212; G02B 7/34; G03B 13/36
See application file for complete search history.

(56) References Cited

U.S. PATENT DOCUMENTS 9,860,438 B2    1/2018  Nakata
10,367,992 B2   7/2019  Nakata
(Continued)

FOREIGN PATENT DOCUMENTS

CN    101035206    9/2007
CN    102693991    2/2008
(Continued)

OTHER PUBLICATIONS

International Search Report and Written Opinion for International (PCT) Patent Application No. PCT/JP2014/056524, dated Apr. 8, 2014, 10 pages.
(Continued)

*Primary Examiner* — Thanh Luu
(74) *Attorney, Agent, or Firm* — Sheridan Ross PC

(57) ABSTRACT

The present technology relates to an image sensor and an electronic apparatus which enable higher-quality images to be obtained. Provided is an image sensor including a plurality of pixels, each pixel including one on-chip lens, and a plurality of photoelectric conversion layers formed below the on-chip lens. Each of at least two of the plurality of photoelectric conversion layers is split, partially formed, or partially shielded from light with respect to a light-receiving surface. The pixels are phase difference detection pixels for performing AF by phase difference detection or imaging pixels for generating an image. The present technology can be applied to a CMOS image sensor, for example.

20 Claims, 21 Drawing Sheets

Related U.S. Application Data continuation of application No. 16/718,591, filed on Dec. 18, 2019, now Pat. No. 11,050,921, which is a continuation of application No. 15/855,785, filed on Dec. 27, 2017, now Pat. No. 10,554,876, which is a continuation of application No. 15/815,324, filed on Nov. 16, 2017, now Pat. No. 10,367,992, which is a continuation of application No. 14/775,826, filed as application No. PCT/JP2014/056524 on Mar. 12, 2014, now Pat. No. 9,860,438.

(51) Int. Cl.
| | |
|---|---|
| H01L 27/146 | (2006.01) |
| H04N 5/265 | (2006.01) |
| H04N 23/10 | (2023.01) |
| H04N 23/55 | (2023.01) |
| H04N 23/67 | (2023.01) |
| H04N 25/13 | (2023.01) |
| H04N 25/702 | (2023.01) |
| H04N 25/704 | (2023.01) |

(52) U.S. Cl.
CPC .. *H01L 27/14621* (2013.01); *H01L 27/14623* (2013.01); *H01L 27/14625* (2013.01); *H01L 27/14627* (2013.01); *H04N 5/265* (2013.01); *H04N 23/10* (2023.01); *H04N 23/55* (2023.01); *H04N 23/67* (2023.01); *H04N 25/134* (2023.01); *H04N 25/702* (2023.01); *H04N 25/704* (2023.01)

(56) References Cited

U.S. PATENT DOCUMENTS

| 10,554,876 | B2 | 2/2020 | Nakata |
| 11,050,921 | B2* | 6/2021 | Nakata ................ H04N 23/672 |
| 2007/0120045 | A1 | 5/2007 | Yokoyama |
| 2010/0176273 | A1 | 7/2010 | Shimoda et al. |
| 2011/0109776 | A1 | 5/2011 | Kawai |
| 2011/0304753 | A1 | 12/2011 | Shintani |
| 2011/0317048 | A1 | 12/2011 | Bai et al. |
| 2013/0002935 | A1 | 1/2013 | Morita |
| 2014/0061439 | A1 | 3/2014 | Toda |
| 2014/0176771 | A1 | 6/2014 | Itou |
| 2015/0222833 | A1 | 8/2015 | Murata |
| 2021/0258500 | A1 | 8/2021 | Nakata |

FOREIGN PATENT DOCUMENTS

| JP | 2006-140249 | 6/2006 |
| JP | 2008-028105 | 2/2008 |
| JP | 2010-160313 | 7/2010 |
| JP | 2012-142994 | 7/2012 |
| JP | 2012-209542 | 10/2012 |
| JP | 2012-242530 | 12/2012 |
| KR | 10-2011-0076769 | 7/2011 |
| KR | 10-2013-0018684 | 2/2013 |
| WO | WO 2013/031537 | 3/2013 |

OTHER PUBLICATIONS

Extended European Search Report for Europe Patent Application No. 14775866.8 dated Mar. 10, 2017, 11 pages.
Official Action (with English translation) for China Patent Application No. 201480010312.9 dated Nov. 10, 2017, 22 pages.
Official Action (with English translation) for Korea Patent Application No. 110-2015-7020202, dated Jun. 16, 2020, 11 pages.
Official Action (with English translation) for China Patent Application No. 201811307280.5, dated Apr. 14, 2021, 38 pages.
Official Action (with English translation) for Korea Patent Application No. 10-2021-7000607, dated Mar. 23, 2021, 11 pages.
Official Action for U.S. Appl. No. 14/775,826, dated May 11, 2017, 6 pages.
Notice of Allowance for U.S. Appl. No. 14/775,826, dated Aug. 23, 2017, 5 pages.
Official Action for U.S. Appl. No. 15/815,324, dated Oct. 9, 2018, 7 pages.
Notice of Allowance for U.S. Appl. No. 15/815,324, dated Mar. 15, 2019, 5 pages.
Official Action for U.S. Appl. No. 15/855,785, dated Oct. 1, 2018, 7 pages.
Official Action for U.S. Appl. No. 15/855,785, dated Feb. 4, 2019, 6 pages.
Official Action for U.S. Appl. No. 15/855,785, dated May 23, 2019, 6 pages.
Notice of Allowance for U.S. Appl. No. 15/855,785, dated Sep. 17, 2019, 6 pages.
Official Action for U.S. Appl. No. 15/718,591, dated Apr. 7, 2020, 7 pages.
Ex Parte Quayle Action for U.S. Appl. No. 15/718,591, dated Jun. 19, 2020, 6 pages.
Official Action for U.S. Appl. No. 15/718,591, dated Sep. 9, 2020, 8 pages.
Notice of Allowance for U.S. Appl. No. 15/718,591, dated Feb. 4, 2021, 5 pages.
Corrected Notice of Allowance for U.S. Appl. No. 15/718,591, dated Mar. 8, 2021, 2 pages.
Corrected Notice of Allowance for U.S. Appl. No. 15/718,591, dated May 19, 2021, 2 pages.
Official Action for U.S. Appl. No. 17/307,548, dated Sep. 8, 2022, 9 pages.
Notice of Allowance for U.S. Appl. No. 17/307,548, dated Dec. 21, 2022, 5 pages.

\* cited by examiner

IMAGE SENSOR AND ELECTRONIC APPARATUS

CROSS-REFERENCE TO RELATED APPLICATIONS

This application is a continuation of U.S. patent application Ser. No. 17/307,548, filed May 4, 2021, which is a continuation of U.S. patent application Ser. No. 16/718,591, filed Dec. 18, 2019, now U.S. Pat. No. 11,050,921, which is a continuation of U.S. patent application Ser. No. 15/855,785, filed Dec. 27, 2017, now U.S. Pat. No. 10,554,876, which is a continuation of U.S. patent application Ser. No. 15/815,324, filed Nov. 16, 2017, now U.S. Pat. No. 10,367,992, which is a continuation of U.S. patent application Ser. No. 14/775,826, filed Sep. 14, 2015, now U.S. Pat. No. 9,860,438, which is a national stage application under 35 U.S.C. 371 and claims the benefit of PCT Application No. PCT/JP2014/056524 having an international filing date of Mar. 12, 2014, which designated the United States, which PCT application claimed the benefit of Japanese Patent Application No. 2013-061952 filed Mar. 25, 2013, the disclosures of which are incorporated herein by reference in their entirety.

FIELD

The present technology relates to image sensors and electronic apparatuses, particularly to an image sensor and an electronic apparatus which enable higher-quality images to be obtained.

BACKGROUND

In recent years, an imaging apparatus that performs phase difference detection by phase difference detection pixels in each of which part of a photoelectric conversion section is shielded from light, the phase difference detection pixels being provided in an image sensor, has been known (e.g., see Patent Literature 1).

CITATION LIST

Patent Literature

Patent Literature 1: JP 2010-160313A

SUMMARY OF THE INVENTION

Technical Problem

In the phase difference detection pixel, however, since part (e.g., half) of the photoelectric conversion section is shielded from light, the sensitivity is lower than that of a normal imaging pixel; therefore, sufficient signal-noise ratio (SNR) cannot be obtained under low illuminance and phase difference detection might not be performed accurately. As a result, the obtained images might be out of focus.

In addition, in the normal imaging pixel, color mixing from the adjacent pixel might adversely affect color reproducibility and SNR.

The present technology, which has been made in view of such circumstances, enables higher-quality images to be obtained.

Solution to Problem

According to an aspect of the present technology, there is provided an image sensor including a plurality of pixels, each pixel including one on-chip lens, and a plurality of photoelectric conversion layers formed below the on-chip lens. Each of at least two of the plurality of photoelectric conversion layers is split, partially formed, or partially shielded from light with respect to a light-receiving surface.

The pixels can be phase difference detection pixels for performing auto focus (AF) by phase difference detection.

A difference in output between the photoelectric conversion layers in the plurality of phase difference detection pixels can be used for the phase difference detection.

Imaging pixels for generating an image can be further included. The phase difference detection pixels can be arranged to be distributed among the plurality of imaging pixels arranged two-dimensionally in a matrix form.

A difference in output between the photoelectric conversion layer in the phase difference detection pixel and the imaging pixel placed around the phase difference detection pixel can be used for the phase difference detection.

The phase difference detection pixel can include an organic photoelectric conversion film partially formed as the top photoelectric conversion layer among the plurality of photoelectric conversion layers, and a photoelectric conversion section partially shielded from light as the photoelectric conversion layer formed in a substrate below the organic photoelectric conversion film.

The phase difference detection pixel can further include, below the organic photoelectric conversion film, a light-shielding film that partially shields the photoelectric conversion section from light. The organic photoelectric conversion film can photoelectrically convert light partially blocked out by the light-shielding film.

The phase difference detection pixel can include, as the plurality of photoelectric conversion layers, at least two layers of photoelectric conversion sections formed in a substrate, each photoelectric conversion section being split.

The phase difference detection pixel can include, as the plurality of photoelectric conversion layers, at least two layers of organic photoelectric conversion films, each organic photoelectric conversion film being split or partially shielded from light.

The pixels can be imaging pixels for generating an image. The imaging pixel can include an organic photoelectric conversion film partially formed as the top photoelectric conversion layer among the plurality of photoelectric conversion layers, and a photoelectric conversion section partially shielded from light at a boundary part with another adjacent imaging pixel, as the photoelectric conversion layer formed in a substrate below the organic photoelectric conversion film. The organic photoelectric conversion film can be formed at the boundary part with the other imaging pixel.

The phase difference detection pixel can include, as the plurality of photoelectric conversion layers, an organic photoelectric conversion film and a photoelectric conversion section that is formed in a substrate. The organic photoelectric conversion film and the photoelectric conversion section can be controlled to have different exposure values.

According to an aspect of the present technology, there is provided an electronic apparatus including: an image sensor including a plurality of pixels, each pixel including one on-chip lens, and a plurality of photoelectric conversion layers formed below the on-chip lens, in which each of at least two of the plurality of photoelectric conversion layers is split, partially formed, or partially shielded from light with respect to a light-receiving surface; and a lens configured to cause object light to enter the image sensor.

A phase difference detection section configured to perform phase difference detection by using a difference in output between the photoelectric conversion layers in the plurality of pixels; and a lens control section configured to control driving of the lens in accordance with a detected phase difference can be further included.

The pixel can further include an organic photoelectric conversion film partially formed as the top photoelectric conversion layer among the plurality of photoelectric conversion layers, and a photoelectric conversion section partially shielded from light as the photoelectric conversion layer formed in a substrate below the organic photoelectric conversion film.

A defect correction section configured to correct, by using an output of the organic photoelectric conversion film, an output of the photoelectric conversion section as a pixel value for generating an image can be further included.

The pixel can include an organic photoelectric conversion film partially formed as the top photoelectric conversion layer among the plurality of photoelectric conversion layers, and a photoelectric conversion section partially shielded from light at a boundary part with another adjacent pixel, as the photoelectric conversion layer formed in a substrate below the organic photoelectric conversion film. The organic photoelectric conversion film can be formed at the boundary part with the other pixel.

A color mixing subtraction section configured to subtract, by using an output of the organic photoelectric conversion film, a color mixing component from an output of the photoelectric conversion section as a pixel value for generating an image can be further included.

A light source estimation section configured to estimate a light source of the object light by using outputs of the plurality of photoelectric conversion layers with different spectral properties can be further included.

A color property correction section configured to correct a color property of a pixel value, which is an output of the photoelectric conversion section, on the basis of an estimation result of the light source estimation section can be further included.

In an aspect of the present technology, each of at least two of the plurality of photoelectric conversion layers is split, partially formed, or partially shielded from light with respect to a light-receiving surface.

Advantageous Effects of Invention

According to an aspect of the present technology, higher-quality images can be obtained.

DETAILED DESCRIPTION OF THE INVENTION

Hereinafter, embodiments of the present technology will be described with reference to the drawings. The description is given in the following order.

1. First embodiment (configuration for performing phase difference detection and defect correction)
2. Second embodiment (configuration for performing color mixing subtraction)
3. Third embodiment (configuration for performing color mixing subtraction and light source estimation)
4. Fourth embodiment (configuration including two image sensors)

1. First Embodiment

Configuration of Imaging Apparatus

Figure 1:
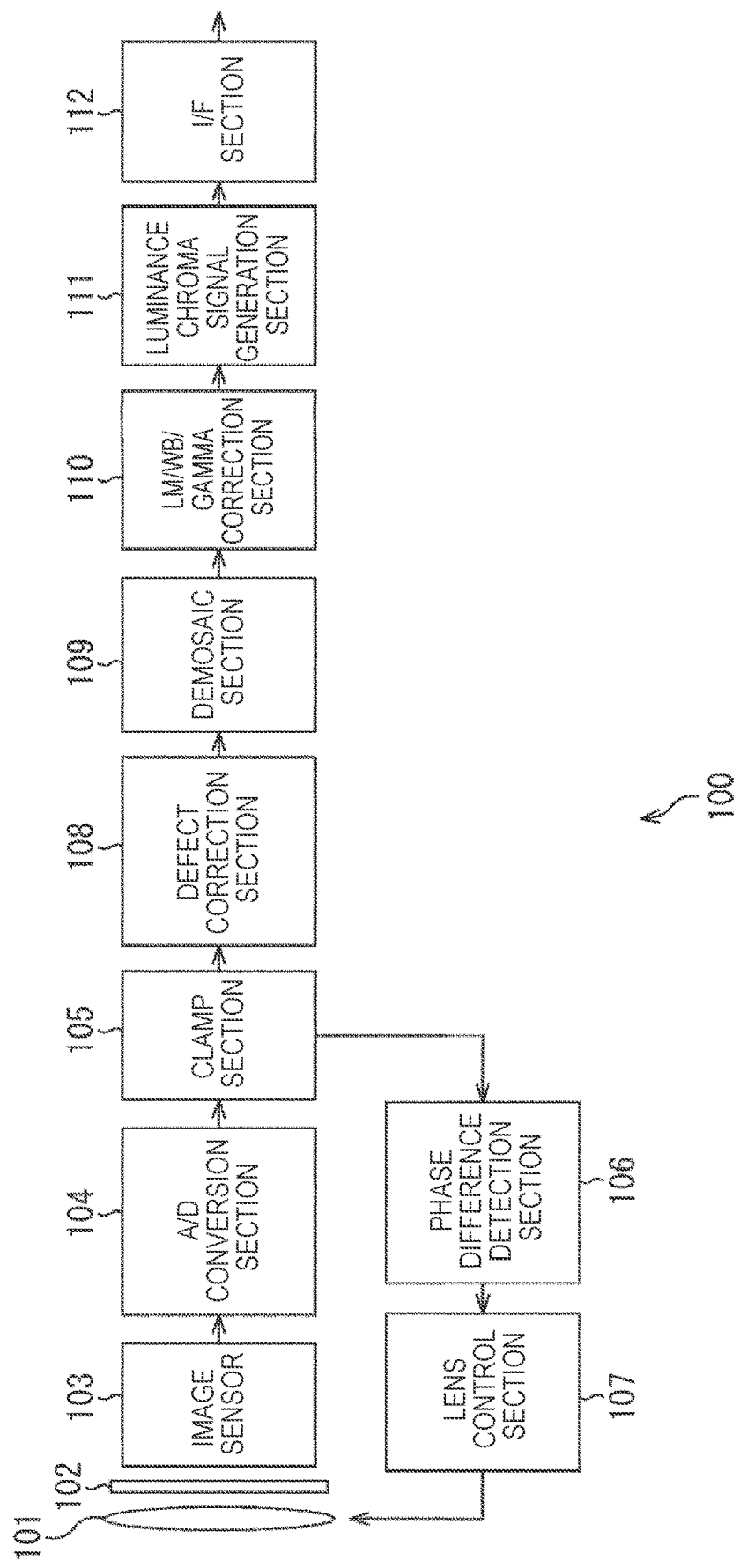
FIG. 1 is a block diagram illustrating an example configuration of an imaging apparatus of a first embodiment of the present technology.

FIG. 1 illustrates an example configuration of an imaging apparatus of a first embodiment of the present technology.

An imaging apparatus 100 illustrated in FIG. 1 is an apparatus that captures an image of an object by performing auto focus (AF) using a phase difference detection method (phase difference AF), and outputs the image of the object as an electrical signal.

The imaging apparatus 100 illustrated in FIG. 1 includes a lens 101, an optical filter 102, an image sensor 103, an A/D conversion section 104, a clamp section 105, a phase difference detection section 106, a lens control section 107, a defect correction section 108, a demosaic section 109, a linear matrix (LM)/white balance (WB)/gamma correction section 110, a luminance chroma signal generation section 111, and an interface (I/F) section 112.

The lens 101 adjusts a focal length of object light that is to enter the image sensor 103. A diaphragm (not shown) that adjusts the amount of the object light that is to enter the image sensor 103 is provided downstream from the lens 101. The lens 101 can have any specific configuration; for example, the lens 101 may be configured with a plurality of lenses.

The object light that has been transmitted through the lens 101 enters the image sensor 103 via the optical filter 102 configured as, for example, an IR-cut filter that transmits light excluding infrared light.

The image sensor 103 is provided with a plurality of pixels including photoelectric conversion devices, such as photodiodes, which photoelectrically convert the object light. Each pixel converts the object light to an electrical signal. The image sensor 103 may be, for example, a CCD image sensor that performs transfer using a circuit device called charge coupled device (CCD) in order to read charge generated from light by the photoelectric conversion devices, or a CMOS image sensor that uses a complementary metal oxide semiconductor (CMOS) and has an amplifier for each unit cell.

The image sensor 103 has color filters for the respective pixels on the object side of the photoelectric conversion devices. As the color filters, filters of colors such as red (R), green (G), and blue (B) are arranged in the Bayer array, for example, above the respective photoelectric conversion devices. That is, the image sensor 103 photoelectrically converts the object light of each color transmitted through the filter, and supplies the resulting electrical signal to the A/D conversion section 104.

The color filters of the image sensor 103 can have any color; a color other than RGB may be included, or some or all colors of RGB may be excluded from use. In addition, the colors can be arranged in any array; an array other than the Bayer array may be adopted. For example, as the array of the color filters of the image sensor 103, an array including a white pixel (disclosed in JP 2009-296276A) or an emerald pixel, or a clear bit array can be applied.

In the image sensor 103, pixels (imaging pixels) that generate signals for generating an image based on the received object light and pixels (phase difference detection pixels) that generate signals for performing AF by phase difference detection are arranged.

Figure 2:
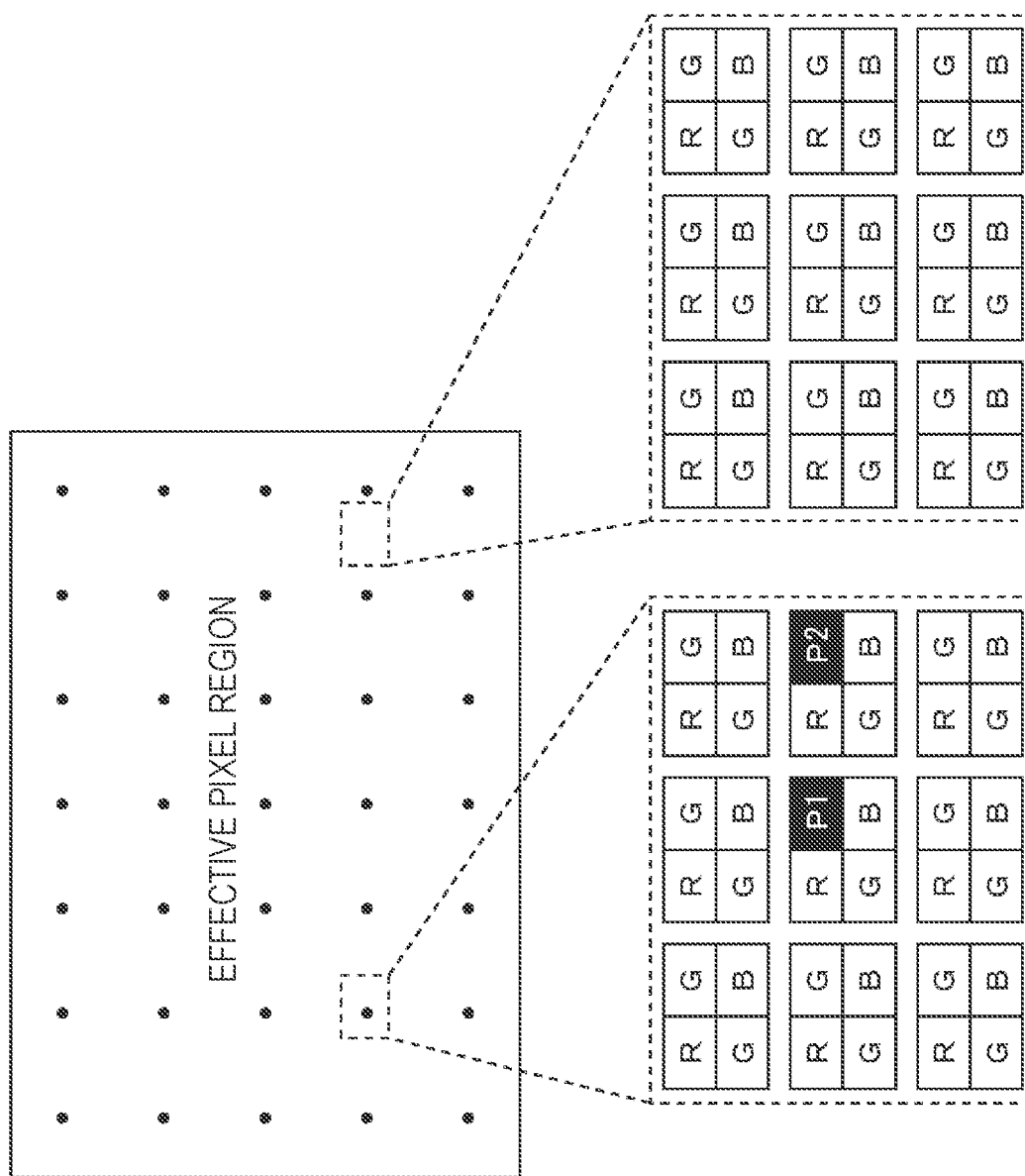
FIG. 2 is a view illustrating a pixel arrangement of an image sensor.

FIG. 2 illustrates an example of the pixel arrangement of the image sensor 103.

As illustrated in FIG. 2, a plurality of imaging pixels indicated by white squares are arranged two-dimensionally in a matrix form in the image sensor 103. The imaging pixels include R pixels, G pixels, and B pixels, which are arranged regularly in accordance with the Bayer array.

Furthermore, in the image sensor 103, a plurality of phase difference detection pixels indicated by black squares are arranged to be distributed among the plurality of imaging pixels arranged two-dimensionally in a matrix form. The phase difference detection pixels replace part of predetermined imaging pixels in the image sensor 103 to be arranged regularly in a specific pattern. In the example of FIG. 2, two G pixels are replaced with phase difference detection pixels P1 and P2. Note that the phase difference detection pixels may be arranged irregularly in the image sensor 103. Regular arrangement of the phase difference detection pixels facilitates signal processing such as defect correction which is described later, and irregular arrangement of the phase difference detection pixels causes artifacts due to defect correction to be irregular, making the artifacts less visible (less likely to be recognized).

Returning to the description of FIG. 1, the A/D conversion section 104 converts electrical signals (analog signals) of RGB supplied from the image sensor 103 to digital data (image data). The A/D conversion section 104 supplies the image data (RAW data) as digital data to the clamp section 105.

The clamp section 105 subtracts a black level, which is a level determined as black, from the image data. The clamp section 105 supplies the image data output from the phase difference detection pixels, among the image data from which the black level has been subtracted, to the phase difference detection section 106. In addition, the clamp section 105 supplies the image data from which the black level has been subtracted for all the pixels to the defect correction section 108.

In other words, while only the output of the phase difference detection pixels is used for phase difference detection, the output of the phase difference detection pixels as well as the output of the imaging pixels is used for generation of images.

The phase difference detection section 106 performs phase difference detection processing based on the image data from the clamp section 105 to determine whether or not focusing is obtained with respect to an object targeted for focusing (focusing target). When an object in a focus area is focused, the phase difference detection section 106 supplies, as a focusing determination result, information indicating that focusing is obtained to the lens control section 107. When the focusing target is not focused, the phase difference detection section 106 calculates the amount of focus deviation (defocus amount) and supplies, as a focusing determination result, information indicating the calculated defocus amount to the lens control section 107.

The lens control section 107 controls the driving of the lens 101. Specifically, the lens control section 107 calculates the driving amount of the lens 101 based on the focusing determination result supplied from the phase difference detection section 106, and moves the lens 101 in accordance with the calculated driving amount.

For example, when focusing is obtained, the lens control section 107 keeps the lens 101 at the current position. When focusing is not obtained, the lens control section 107 calculates the driving amount based on the focusing determination result indicating the defocus amount and the position of the lens 101, and moves the lens 101 in accordance with the driving amount.

In addition to the above-described phase difference AF, the lens control section 107 may perform contrast AF to control the driving of the lens 101. For example, when information indicating the amount of focus deviation (defocus amount) is supplied as the focusing determination result from the phase difference detection section 106, the lens control section 107 may determine the direction of focus deviation (front focus or rear focus) and perform contrast AF with respect to the direction.

Based on the image data from the clamp section 105, the defect correction section 108 performs correction of pixel values, i.e., defect correction, on defective pixels where correct pixel values cannot be obtained. The defect correction section 108 supplies the image data subjected to the correction of defective pixels to the demosaic section 109.

The demosaic section 109 performs demosaic processing on the RAW data from the defect correction section 108, performing complementation of color information or the like, to convert the RAW data to RGB data. The demosaic section 109 supplies the image data (RGB data) after the demosaic processing to the LM/WB/gamma correction section 110.

The LM/WB/gamma correction section 110 performs correction of color property on the RGB data from the demosaic section 109. Specifically, the LM/WB/gamma correction section 110 performs processing of correcting, in order to fill the gap between chromaticity points of primary colors (RGB) defined by the standard and chromaticity points of an actual camera, color signals of the image data using a matrix coefficient to change color reproducibility. In addition, the LM/WB/gamma correction section 110 sets a gain for white with respect to the value of each channel of the RGB data to adjust white balance. Furthermore, the LM/WB/gamma correction section 110 performs gamma correction for adjusting the relative relationship between colors of the image data and output device property so as to obtain display closer to the original. The LM/WB/gamma correction section 110 supplies the image data (RGB data) after the correction to the luminance chroma signal generation section 111.

The luminance chroma signal generation section 111 generates a luminance signal (Y) and chroma signals (Cr and Cb) from the RGB data supplied from the LM/WB/gamma correction section 110. Upon generating the luminance chroma signals (Y, Cr, and Cb), the luminance chroma signal generation section 111 supplies the luminance signal and chroma signals to the I/F section 112.

The I/F section 112 outputs the supplied image data (luminance chroma signals) to the outside of the imaging apparatus 100 (e.g., a storage device that stores the image data or a display device that displays images based on the image data).

Example Structure of Phase Difference Detection Pixel

Figure 3:
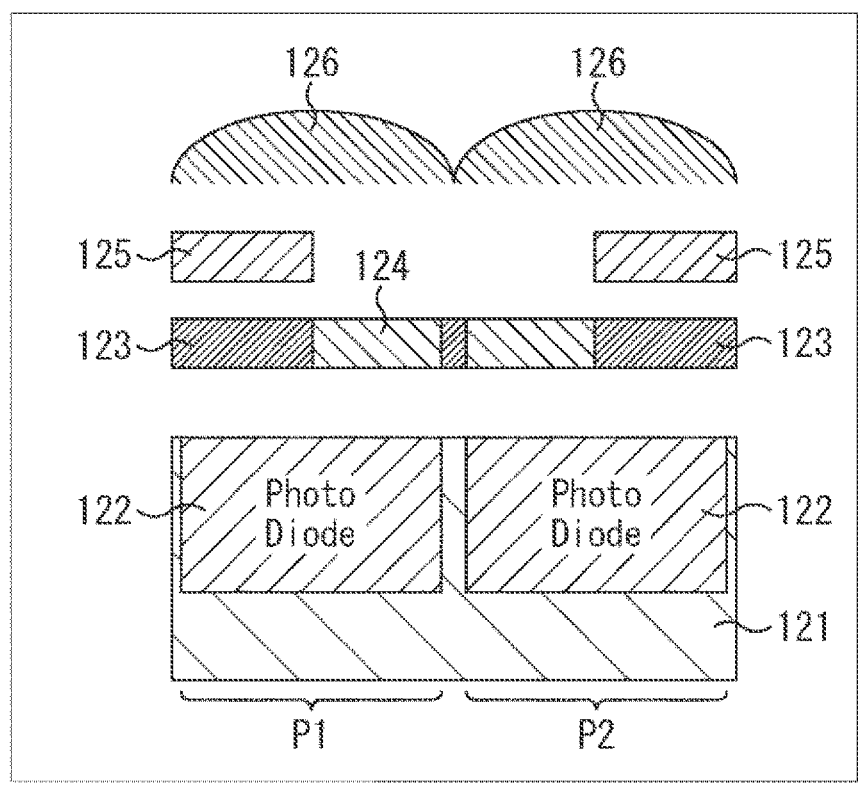
FIG. 3 is a cross-sectional view illustrating an example structure of phase difference detection pixels of the present technology.

FIG. 3 is a cross-sectional view illustrating an example structure of phase difference detection pixels of the present technology. The phase difference detection pixels P1 and P2 are arranged adjacent to each other in FIG. 3, but may be arranged with a predetermined number of imaging pixels placed therebetween as illustrated in FIG. 2.

As illustrated in FIG. 3, a photodiode 122 as a photoelectric conversion section is formed in a semiconductor substrate (Si substrate) 121 in each of the phase difference detection pixels P1 and P2. Above the semiconductor substrate 121, a light-shielding film 123 and a color filter 124 are formed in the same layer, and above them, specifically, right above the light-shielding film 123, an organic photoelectric conversion film 125 having substantially the same area as the light-shielding film 123 is formed. In addition, an on-chip lens 126 is formed above the organic photoelectric conversion film 125.

The light-shielding film 123 may be made of metal, or may be a black filter that absorbs light. Alternatively, the light-shielding film 123 may be configured with an electrode of the organic photoelectric conversion film 125. In that case, a wiring layer can be omitted, which results in lower height of the image sensor 103, contributing to improved sensitivity of the photodiode 122.

The color of the color filter 124 may be the same or different between the phase difference detection pixel P1 and the phase difference detection pixel P2. In the case where the phase difference detection pixels P1 and P2 are white pixels, it is possible not to provide the color filter 124.

The organic photoelectric conversion film 125 photoelectrically converts light with a specific wavelength. For example, the organic photoelectric conversion film 125 photoelectrically converts light of one of the three colors, red, green, and blue.

As an organic photoelectric conversion film that photoelectrically converts green light, for example, an organic photoelectric conversion material including a rhodamine-based dye, a meracyanine-based dye, quinacridone, or the like can be used. As an organic photoelectric conversion film that photoelectrically converts red light, an organic photoelectric conversion material including a phthalocyanine-based dye can be used. As an organic photoelectric conversion film that photoelectrically converts blue light, an organic photoelectric conversion material including a coumarin-based dye, tris-(8-hydrixyquinoline)aluminum (Alq3), a meracyanine-based dye, or the like can be used.

The organic photoelectric conversion film 125 may also photoelectrically convert light other than visible light (e.g., red light, green light, and blue light), such as white light, infrared light, or ultraviolet light.

Each phase difference detection pixel illustrated in FIG. 3 is provided with one on-chip lens 126 and a plurality of photoelectric conversion layers formed below the on-chip lens 126, specifically, the organic photoelectric conversion film 125 and the photodiode 122 from the top. Here, when the surface where the on-chip lens 126 is formed is defined as a light-receiving surface of each pixel, the organic photoelectric conversion film 125 is formed partly with respect to the light-receiving surface (hereinafter described as being partially formed). In addition, part (e.g., half) of the photodiode 122 is shielded from light by the light-shielding film 123 (hereinafter, the photodiode 122 is described as being partially shielded from light).

In FIG. 3, the phase difference detection pixels P1 and P2 are shielded from light on the left side and the right side, respectively; however, depending on the pixel arrangement, the phase difference detection pixels may be shielded from light on the upper side and the lower side, or may be obliquely shielded from light.

Figure 4:
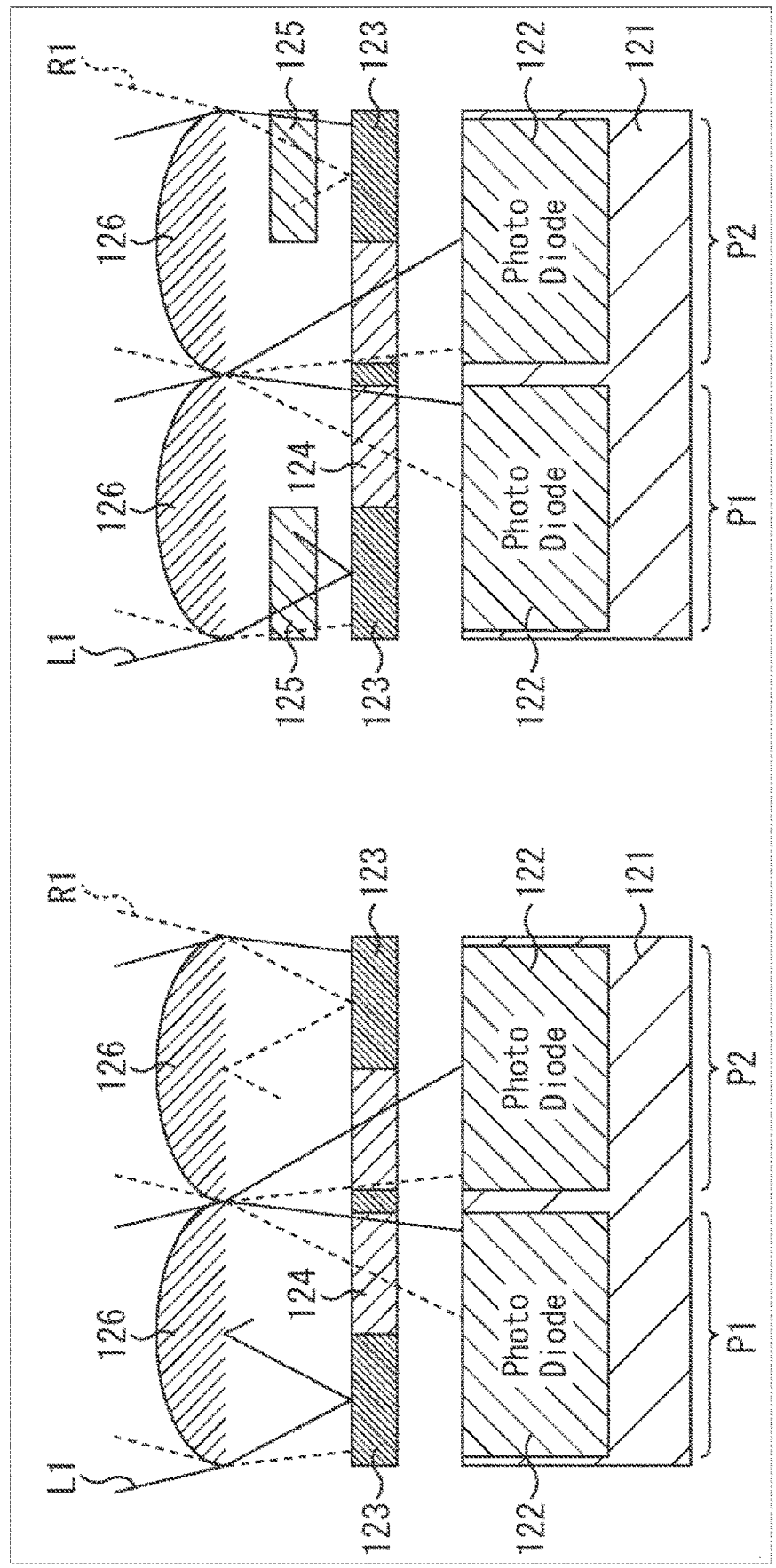
FIG. 4 is a view comparing conventional phase difference detection pixels and phase difference detection pixels of the present technology.

Next, referring to FIG. 4, a conventional phase difference detection pixel and a phase difference detection pixel of the present technology are compared in structure.

The conventional phase difference detection pixel illustrated on the left side in FIG. 4 differs from the phase difference detection pixel of the present technology illustrated on the right side in FIG. 4 in that the organic photoelectric conversion film 125 is not provided.

With the structure of the conventional phase difference detection pixel, part of incident light L1 is reflected by the light-shielding film 123 of the pixel on the left side and then diffusely reflected within the image sensor 103, and part of incident light R1 is reflected by the light-shielding film 123 of the pixel on the right side and then diffusely reflected within the image sensor 103. This diffuse reflection might cause flare or color mixing into adjacent pixels.

In addition, since half of the photodiode 122 is shielded from light by the light-shielding film 123 in the conventional phase difference detection pixel, sufficient SNR cannot be obtained under low illuminance and phase difference detection might not be performed accurately.

Furthermore, although the output of the phase difference detection pixel is also used for the generation of an image as described above, since the output of the phase difference detection pixel is smaller than the output of an imaging pixel for the above reason, it has been necessary to correct the output of the phase difference detection pixel based on the output of imaging pixels around the phase difference detection pixel.

In contrast, with the structure of the phase difference detection pixel of the present technology, part of incident light L1 is transmitted through the organic photoelectric conversion film 125 of the pixel on the left side, partly being absorbed thereby, and reflected by the light-shielding film 123, then being absorbed by the organic photoelectric conversion film 125 again. Similarly, part of incident light R1 is transmitted through the organic photoelectric conversion film 125 of the pixel on the right side, partly being absorbed thereby, and reflected by the light-shielding film 123, then being absorbed by the organic photoelectric conversion film 125 again. This structure can reduce diffused reflection of incident light within the image sensor 103 and prevent flare or color mixing into adjacent pixels.

In addition, since incident light, which is conventionally blocked out, is subjected to photoelectric conversion by the organic photoelectric conversion film 125 in the phase difference detection pixel of the present technology, the output of the organic photoelectric conversion film 125 can be obtained in addition to the output of the photodiode 122. Thus, sufficient SNR can be obtained even under low illuminance and phase difference detection can be performed accurately.

Since incident light that is transmitted through the organic photoelectric conversion film 125 and reflected by the light-shielding film 123 enters the organic photoelectric conversion film 125 again, the efficiency of photoelectric conversion in the organic photoelectric conversion film 125 can be increased. This increase further improves the accuracy of phase difference detection. In addition, in the case where the organic photoelectric conversion film 125 can provide sufficient output even with a small thickness, the height of the image sensor 103 can be lowered, which contributes to improved sensitivity of the photodiode 122.

Furthermore, since the output of the organic photoelectric conversion film 125 can be obtained in addition to the output of the photodiode 122, there is no need to correct the output of the phase difference detection pixel based on the output of imaging pixels around the phase difference detection pixel.

Phase Difference AF Processing

Here, phase difference AF processing executed by the imaging apparatus 100 is described with reference to the flowchart in FIG. 5. The phase difference AF processing is executed before imaging processing, which is executed by the imaging apparatus 100 at the time of capturing an image of an object.

First, in step S101, the image sensor 103 photoelectrically converts incident light of each pixel, reads pixel signals, and supplies the pixel signals to the A/D conversion section 104.

In step S102, the A/D conversion section 104 performs A/D conversion on the pixel signals from the image sensor 103, and supplies the resulting pixel signals to the clamp section 105.

In step S103, the clamp section 105 subtracts a black level that is detected in an optical black (OPB) region provided outside an effective pixel region from the pixel signals (pixel values) from the A/D conversion section 104. The clamp section 105 supplies the image data (pixel values) output from the phase difference detection pixels, among the image data from which the black level has been subtracted, to the phase difference detection section 106.

In step S104, the phase difference detection section 106 performs phase difference detection processing based on the image data from the clamp section 105 to perform focusing determination. The phase difference detection processing is performed by using a difference in output between pixels where the light-receiving surfaces are shielded from light on opposite sides, like the phase difference detection pixels P1 and P2 illustrated in FIG. 4.

Conventionally, when the outputs of the photodiodes 122 in the conventional phase difference detection pixels P1 and P2 illustrated on the left side in FIG. 4 are expressed as $PhasePixel_{P1}$ and $PhasePixel_{P2}$, respectively, a phase difference $Phase_{Diff}$ to be detected is calculated based on, for example, the following formulas (1) and (2).

Math. 1

$$Phase_{Diff} = (PhasePixel_{P1} - PhasePixel_{P2}) \qquad (1)$$

Math. 2

$$Phase_{Diff} = (PhasePixel_{P1} / PhasePixel_{P2}) \qquad (2)$$

In contrast, in the present technology, when the outputs of the photodiodes 122 in the phase difference detection pixels P1 and P2 of the present technology illustrated on the right side in FIG. 4 are expressed as $PhasePixel_{P1}$ and $PhasePixel_{P2}$, respectively, and the outputs of the organic photoelectric conversion films 125 are expressed as $PhasePixel_{Organic1}$ and $PhasePixel_{Organic2}$, respectively, a phase difference $Phase_{Diff}$ to be detected is calculated based on, for example, the following formulas (3), (4), and (5).

Math. 3

$$Phase_{Diff} = (PhasePixel_{P1} + PhasePixel_{Organic2}) - (PhasePixel_{P2} + PhasePixel_{Organic1})$$

$$Phase_{Diff} = (PhasePixel_{P1} + PhasePixel_{Organic2}) - (PhasePixel_{P2} + PhasePixel_{Organic1}) \qquad (3)$$

Math. 4

$$Phase_{Diff} = (PhasePixel_{P1} - PhasePixel_{Organic1}) - (PhasePixel_{P2} - PhasePixel_{Organic1})$$

$$Phase_{Diff} = (PhasePixel_{P1} - PhasePixel_{Organic1}) - (PhasePixel_{P2} - PhasePixel_{Organic1}) \qquad (4)$$

Math. 5

$$Phase_{Diff} = (PhasePixel_{P1} / PhasePixel_{P2}) \times (PhasePixel_{Organic2} / PhasePixel^{Organic1})$$

$$Phase_{Diff} = (PhasePixel_{P1} / PhasePixel_{P2}) \times (PhasePixel_{Organic2} / PhasePixel^{Organic1}) \qquad (5)$$

In addition, in the present technology, it is also possible to calculate a difference $Phase_{Diff_A}$ between the outputs of the photodiodes 122 of the phase difference detection pixels P1 and P2 and a difference $Phase_{Diff_B}$ between the outputs of the organic photoelectric conversion films 125 of the phase difference detection pixels P1 and P2 based on the following formulas (6) and (7), determine the certainty of each of them, for example, and set one of $\text{Phase}_{Diff_A}$ and $\text{Phase}_{Diff_B}$ as a phase difference.

Math. 6

$$\text{Phase}_{Diff_A} = \text{PhasePixel}_{P1} - \text{PhasePixel}_{P2} \qquad (6)$$

Math. 7

$$\text{Phase}_{Diff_B} = \text{PhasePixel}_{Organic2} - \text{PhasePixel}_{Organic1} \qquad (7)$$

In the above formulas (3) to (7), the output values of the photodiodes 122 and the organic photoelectric conversion films 125 of the respective phase difference detection pixels P1 and P2 are used as they are as $\text{PhasePixel}_{P1}$ and $\text{PhasePixel}_{P2}$ and $\text{PhasePixel}_{Organic1}$ and PhasePixel_Organic2; however, it is also possible to use these outputs to which a gain is applied by using a predetermined coefficient. Furthermore, the phase difference calculated by using the output values of the photodiodes 122 and the organic photoelectric conversion films 125 of the respective phase difference detection pixels P1 and P2 is not limited to those calculated based on the above formulas (3) to (7), and may be calculated by application of another computation.

As described above, in the conventional phase difference detection pixels, only the outputs of the photodiodes 122 of the respective two pixels can be used for phase difference detection. In the phase difference detection pixels of the present technology, in addition to the outputs of the photodiodes 122 of the respective two pixels, the outputs of the organic photoelectric conversion films 125 of the respective pixels can be used for phase difference detection.

When the phase difference detection processing is performed in this way and focusing determination is performed, the phase difference detection section 106 supplies the focusing determination result to the lens control section 107.

In step S105, the lens control section 107 controls the driving of the lens 101 based on the focusing determination result from the phase difference detection section 106.

According to the above-described processing, in addition to the outputs of the photodiodes 122 of the respective two pixels, the outputs of the organic photoelectric conversion films 125 of the respective pixels can be used for phase difference detection; therefore, the signal amount used for the phase difference detection can be increased. Thus, sufficient SNR can be obtained even under low illuminance and phase difference detection can be performed accurately. As a result, higher-quality images which are not out of focus can be obtained.

Imaging Processing

Next, imaging processing executed by the imaging apparatus 100 is described with reference to the flowchart in FIG. 6.

Figure 5:
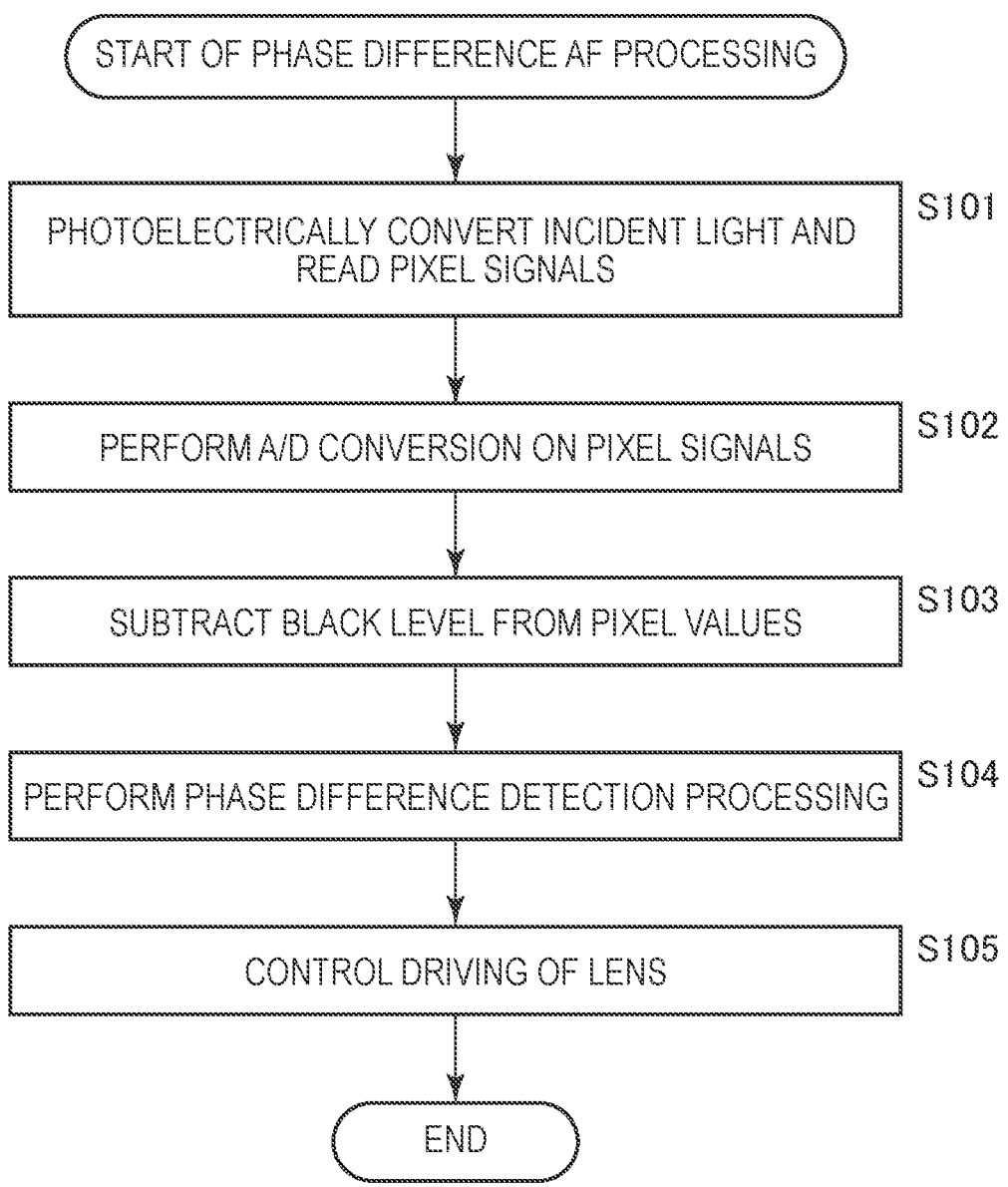
FIG. 5 is a flowchart for describing AF processing.
Figure 6:
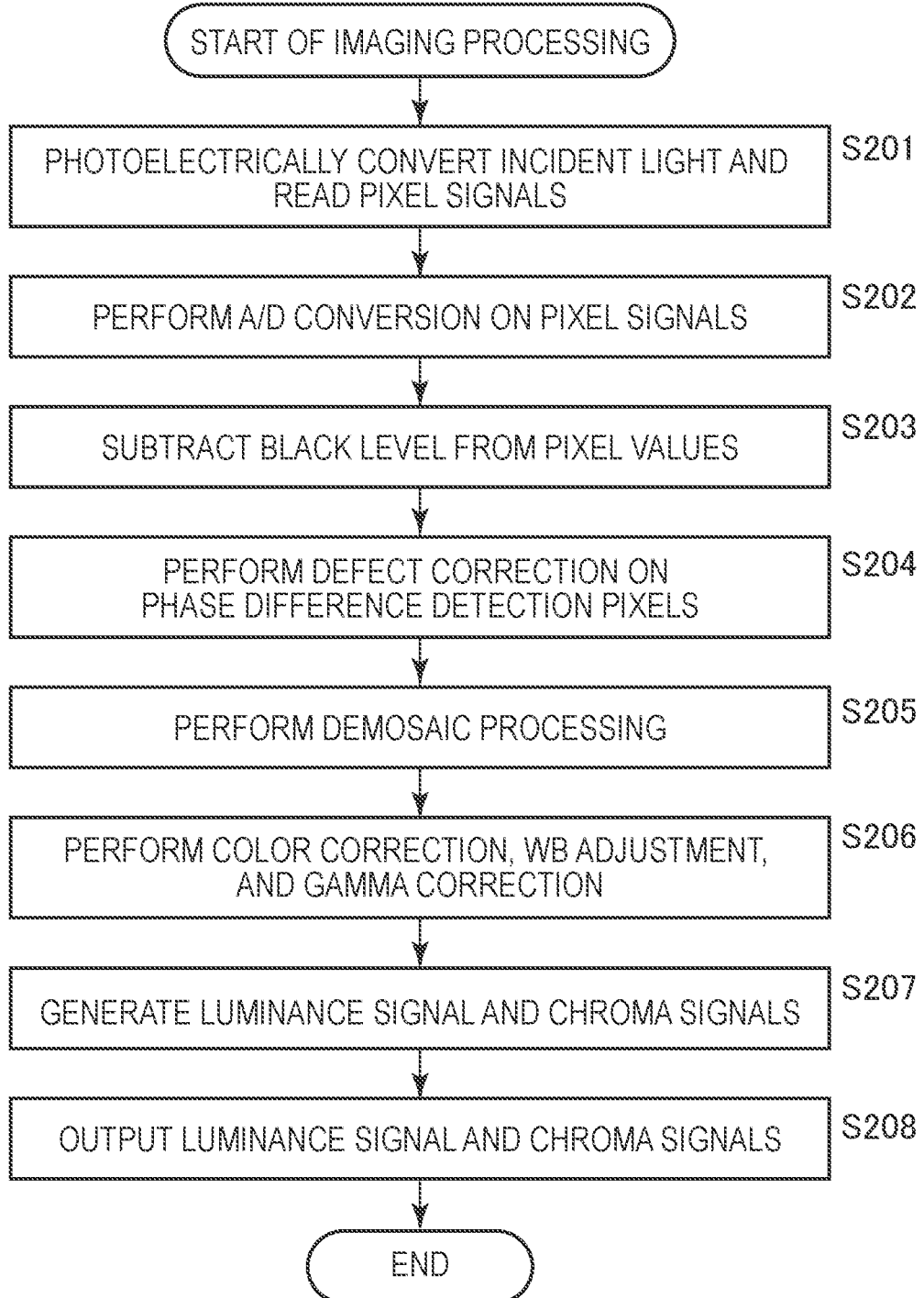
FIG. 6 is a flowchart for describing imaging processing.

Here, the processing of steps S201 to S203 of the flowchart in FIG. 6 is the same as the processing of steps S101 to S103 of the flowchart in FIG. 5, and therefore is not repeatedly described. Note that in step S203, the clamp section 105 supplies the image data (pixel values) from which the black level has been subtracted for all the pixels to the defect correction section 108.

In step S204, based on the image data from the clamp section 105, the defect correction section 108 performs correction of pixel values (defect correction) on defective pixels where correct pixel values cannot be obtained, that is, phase difference detection pixels.

Figure 7:
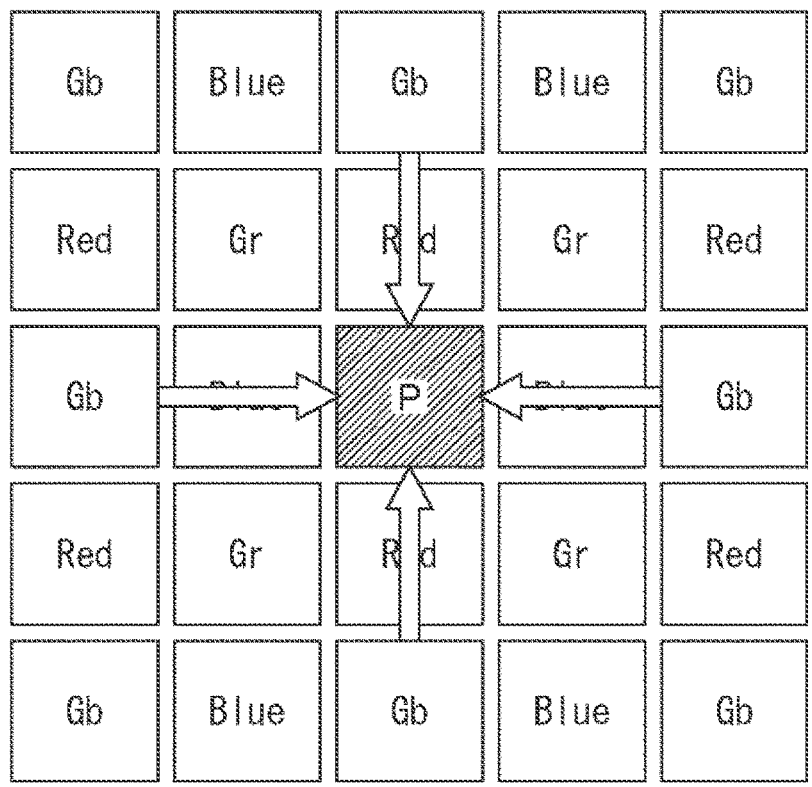
FIG. 7 is a view for describing a conventional technique for defect correction.

In the conventional phase difference detection pixel, only the output of the photodiode 122, which is shielded from light, can be obtained as its output (pixel value). Therefore, as a technique for defect correction of the phase difference detection pixel, the output of a phase difference detection pixel P targeted for correction is replaced based on the output of a same-color pixel around the phase difference detection pixel P as illustrated in FIG. 7, for example.

In the above technique, however, since the pixel value of the correction target is replaced with a value based on the output of a pixel around the correction target, the original pixel value of the phase difference detection pixel P is completely ignored. This ignorance is equivalent to a decrease in resolution and might degrade the image quality.

In contrast, in the phase difference detection pixel of the present technology, in addition to the output of the photodiode 122, which is shielded from light, the output of the organic photoelectric conversion film 125 is obtained as its output (pixel value). Thus, by estimating the output corresponding to the blocked out light by using the output of the organic photoelectric conversion film 125, a pixel value P1_Out of the phase difference detection pixel P1 after defect correction is calculated based on, for example, the following formula (8).

Math. 8

$$P1_{Out} = (\text{PhasePixel}_{P1} \times \alpha) + (\text{PhasePixel}_{Organic1} \times \beta) \qquad (8)$$

In the formula (8), $\alpha$ and $\beta$ are coefficients decided depending on a difference in sensitivity between the photodiode 122 and the organic photoelectric conversion film 125.

According to the formula (8), the original pixel value of the phase difference detection pixel P1 can be used as the pixel value of the correction target; therefore, a decrease in resolution can be suppressed, leading to improved image quality.

The pixel value of the phase difference detection pixel after the defect correction is not limited to that calculated based on the above formula (8), and may be calculated by application of another computation.

The image data subjected to the correction of defective pixels in this manner is supplied to the demosaic section 109.

In step S205, the demosaic section 109 performs demosaic processing to convert RAW data to RGB data, and supplies the RGB data to the LM/WB/gamma correction section 110.

In step S206, the LM/WB/gamma correction section 110 performs color correction, adjustment of white balance, and gamma correction on the RGB data from the demosaic section 109, and supplies the resulting data to the luminance chroma signal generation section 111.

In step S207, the luminance chroma signal generation section 111 generates a luminance signal and chroma signals (YCrCb data) from the RGB data.

In step S208, the I/F section 112 outputs the luminance signal and chroma signals generated by the luminance chroma signal generation section 111 to an external storage device or display device, and the imaging processing is ended.

According to the above-described processing, the output corresponding to the blocked out light can be estimated and the original pixel value of the phase difference detection pixel can be used in the defect correction of the phase difference detection pixel. Therefore, a decrease in resolution can be suppressed, leading to improved image quality; thus, higher-quality images can be obtained.

Figure 8:
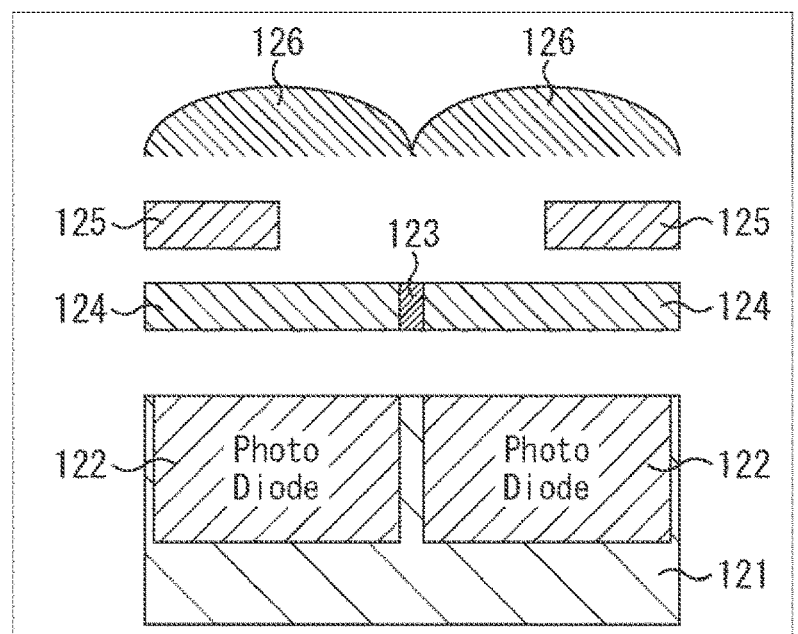
FIG. 8 is a cross-sectional view illustrating another example structure of phase difference detection pixels.

In the phase difference detection pixel illustrated in FIG. 3, when the attenuation factor of light with a wavelength to be photoelectrically converted by the organic photoelectric conversion film 125 (transmission wavelength of the color filter 124) is sufficient, a part of the light-shielding film 123 that shields half of the photodiode 122 may be omitted as illustrated in FIG. 8.

Such a structure can reduce diffuse reflection of light reflected by the light-shielding film 123 and prevent flare or color mixing into adjacent pixels. Furthermore, in the case where the light-shielding film 123 is completely omitted, the number of manufacturing steps can be reduced.

The organic photoelectric conversion film 125 may be provided below the light-shielding film 123 and the color filter 124.

According to the above description, phase difference detection is performed using differences between the photoelectric conversion layers (the photodiodes 122 and the organic photoelectric conversion films 125) in the phase difference detection pixels. Alternatively, phase difference detection may be performed using differences between the outputs of photoelectric conversion layers in phase difference detection pixels and the outputs of imaging pixels arranged around the phase difference detection pixels.

Another Example Structure of Phase Difference Detection Pixel

Figure 9:
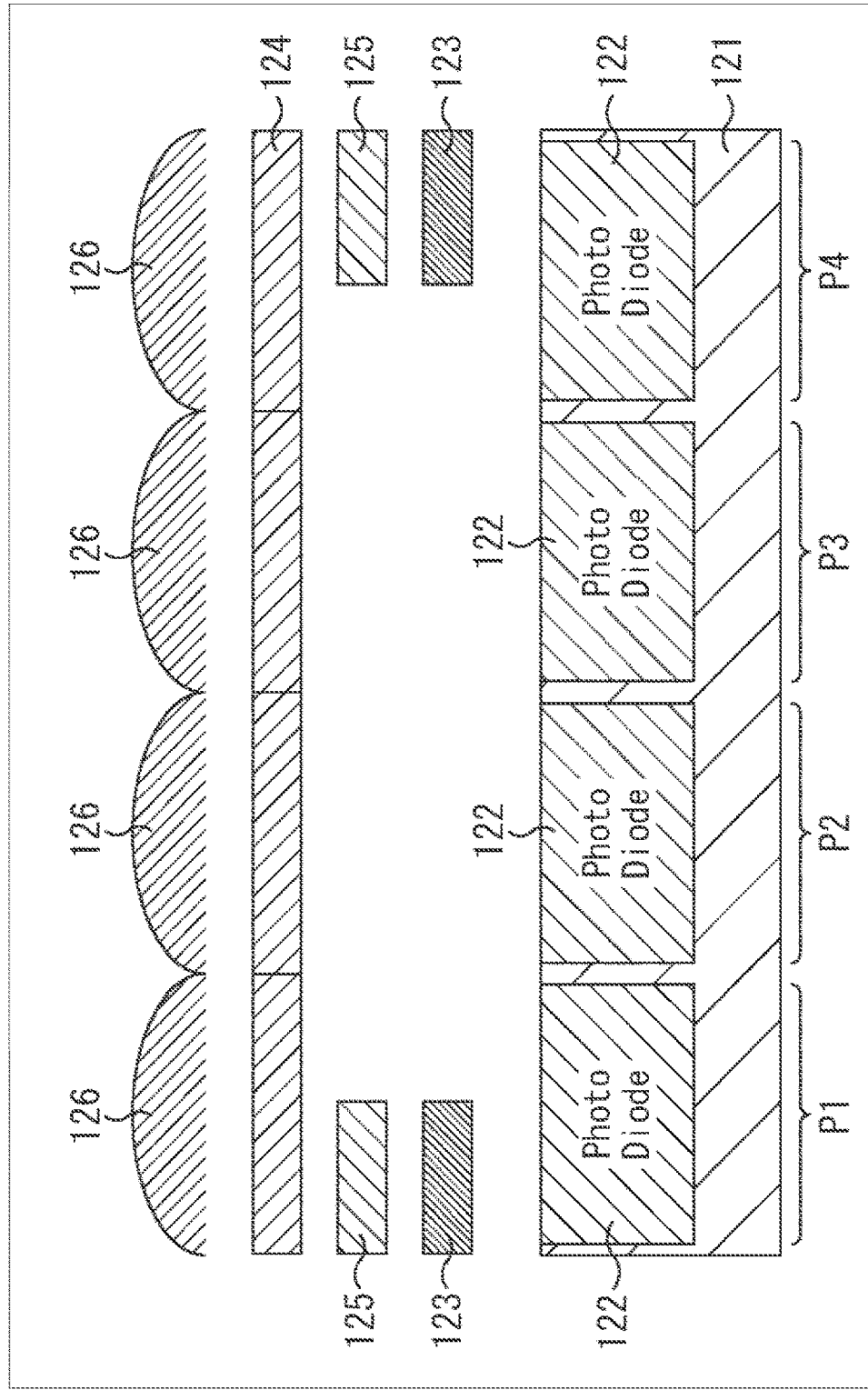
FIG. 9 is a cross-sectional view illustrating further another example structure of phase difference detection pixels.

FIG. 9 is a cross-sectional view illustrating another example structure of phase difference detection pixels of the present technology.

The cross-sectional view in FIG. 9 differs from the cross-sectional view in FIG. 3 in that imaging pixels P2 and P3 are arranged between phase difference detection pixels P1 and P4 and that the color filter 124 is not formed in the same layer as the light-shielding film 123 but formed above the organic photoelectric conversion film 125.

In the case where the image sensor 103 includes pixels with the structure illustrated in FIG. 9, phase difference detection processing is performed using the outputs of the phase difference detection pixels and the outputs of the adjacent imaging pixels.

Specifically, based on the following formulas (9) to (11), a difference $Phase_{Diff_A}$ between the outputs of the organic photoelectric conversion films 125 of the phase difference detection pixels P1 and P4, a difference $Phase_{Diff_B}$ between the outputs of the photodiodes 122 of the imaging pixel P2 and the phase difference detection pixel P1, and a difference $Phase_{Diff_C}$ between the outputs of the photodiodes 122 of the imaging pixel P3 and the phase difference detection pixel P4 are calculated, and a predetermined computation is performed on each of the differences to calculate the final phase difference.

Math. 9

$$P1_{Diff_A} = \text{Organic1} - \text{Organic2} \quad (9)$$

Math. 10

$$P1_{Diff_B} = \text{PhotoDiode2} - \text{PhotoDiode1} \times \alpha \quad (10)$$

Math. 11

$$P1_{Diff_C} = \text{PhotoDiode3} - \text{PhotoDiode4} \times \beta \quad (11)$$

Note that α in the formula (10) and β in the formula (11) are coefficients decided depending on a decrease in sensitivity due to light shielding by the light-shielding film 123 in the phase difference detection pixels P1 and P4.

As described above, in the phase difference detection processing, it is possible to use not only differences in output between the phase difference detection pixels but also differences between the outputs of photoelectric conversion layers in the phase difference detection pixels and the outputs of the imaging pixels arranged around the phase difference detection pixels.

Further Another Example Structure of Phase Difference Detection Pixel

Figure 10:
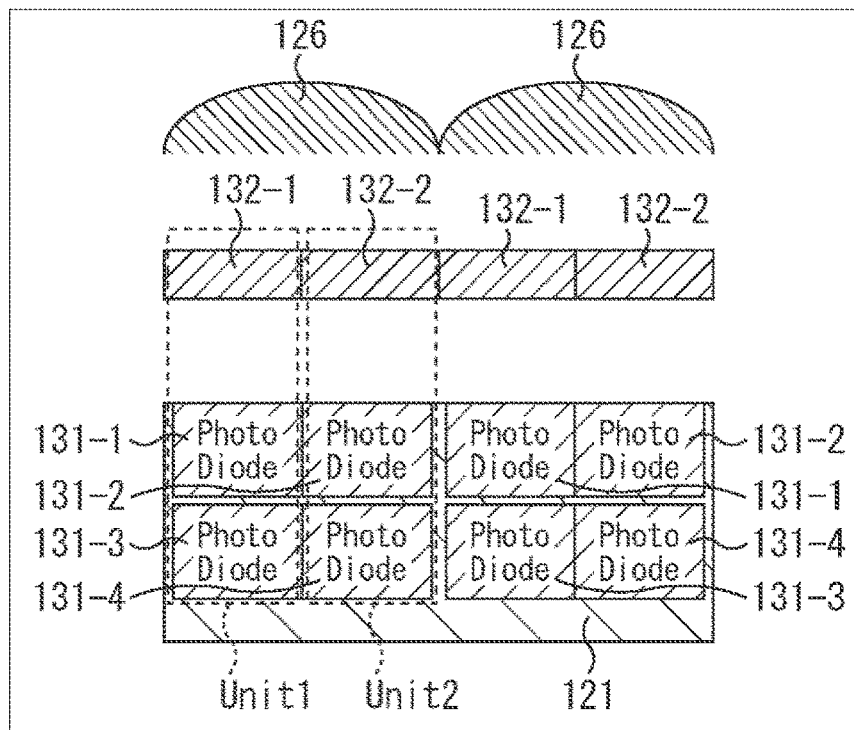
FIG. 10 is a cross-sectional view illustrating further another example structure of phase difference detection pixels.

FIG. 10 is a cross-sectional view illustrating further another example structure of phase difference detection pixels of the present technology.

In each of the phase difference detection pixels illustrated in FIG. 10, photodiodes 131-1 to 131-4 as photoelectric conversion sections are formed in the semiconductor substrate 121. Above the semiconductor substrate 121, organic photoelectric conversion films 132-1 and 132-2 are formed. In addition, the on-chip lens 126 is formed above organic photoelectric conversion films 32-1 and 132-2.

Each phase difference detection pixel illustrated in FIG. 10 is provided with one on-chip lens 126 and a plurality of photoelectric conversion layers formed below the on-chip lens 126, specifically, the organic photoelectric conversion films 132-1 and 132-2 and the photodiodes 131-1 to 131-4 from the top. The organic photoelectric conversion films 132-1 and 132-2 are formed separately with respect to the light-receiving surface (hereinafter described as being separately formed). The photodiodes 131-1 to 131-4 are formed as two layers in the cross-sectional height direction and are separately formed in each layer.

Note that techniques for forming a plurality of photodiodes in the cross-sectional height direction are disclosed in JP 2011-29337A and JP 2011-40518A, for example.

In the phase difference detection pixel illustrated in FIG. 10, the photoelectric conversion layers, that is, the organic photoelectric conversion films 132-1 and 132-2 in the top layer, the photodiodes 131-1 and 131-2 in the second layer from the top, and the photodiodes 131-3 and 131-4 in the third layer from the top, photoelectrically convert light with the respective different wavelengths. For example, the organic photoelectric conversion films 132-1 and 132-2 photoelectrically convert green light, the photodiodes 131-1 and 131-2 photoelectrically convert blue light, and the photodiodes 131-3 and 131-4 photoelectrically convert red light.

Here, in one phase difference detection pixel, the photodiodes 131-1 and 131-3 and the organic photoelectric conversion film 132-1 formed on the left side in the figure are called a unit 1, and the photodiodes 131-2 and 131-4 and the organic photoelectric conversion film 132-2 formed on the right side in the figure are called a unit 2.

In the case where the image sensor 103 includes phase difference detection pixels with the structure illustrated in FIG. 10, phase difference detection processing is performed using a difference between the output of the unit 1 and the output of the unit 2.

Specifically, when the outputs of the photodiodes 131-1 to 131-4 in the phase difference detection pixel illustrated in FIG. 10 are expressed as PhotoDiode1 to PhotoDiode4, respectively, and the outputs of the organic photoelectric conversion films 132-1 and 132-2 are expressed as Organic1 and Organic2, respectively, a phase difference $Phase_{Diff}$ to be detected is calculated based on, for example, the following formulas (12), (13), (14), and (15).

Math. 12

$$Phase_{Diff} = (\text{PhotoDiode1} - \text{PhotoDiode2}) + (\text{PhotoDiode3} - \text{PhotoDiode4}) + (\text{Organic1} - \text{Organic2}) \quad (12)$$

Math. 13

$$Phase_{Diff}=(PhotoDiode1/PhotoDiode2)\times(PhotoDiode3/PhotoDiode4\times Organic1/Organic2) \quad (13)$$

Math. 14

$$Phase_{Diff}=(PhotoDiode1+PhotoDiode3+Organic1)-(PhotoDiode2+PhotoDiode4+Organic2) \quad (14)$$

Math. 15

$$Phase_{Diff}=(PhotoDiode1+PhotoDiode3+Organic1)/(PhotoDiode2+PhotoDiode4+Organic2) \quad (15)$$

In addition, it is also possible to calculate a difference $Phase_{Diff_A}$ between the outputs of the photodiodes 131-1 and 131-2, a difference $Phase_{Diff_B}$ between the outputs of the photodiodes 131-3 and 131-4, and a difference $Phase_{Diff_C}$ between the outputs of the organic photoelectric conversion films 132-1 and 132-2 based on the following formulas (16), (17), and (18), determine the certainty of each of them, for example, and set one of $Phase_{Diff_A}$, $Phase_{Diff_B}$, and $Phase_{Diff_C}$ as a phase difference.

Math. 16

$$Phase_{Diff_A}=PhotoDiode1-PhotoDiode2 \quad (16)$$

Math. 17

$$Phase_{Diff_B}=PhotoDiode3-PhotoDiode4 \quad (17)$$

Math. 18

$$Phase_{Diff_C}=Organic1-Organic2 \quad (18)$$

Since $Phase_{Diff_A}$, $Phase_{Diff_B}$, and $Phase_{Diff_C}$ are phase differences for the respective color components, it is also possible to determine the illumination environment or the color of an object and set one of $Phase_{Diff_A}$, $Phase_{Diff_B}$ and $Phase_{Diff_C}$ as a phase difference.

Furthermore, it is also possible to weight $Phase_{Diff_A}$, $Phase_{Diff_B}$, and $Phase_{Diff_C}$ by using at least one or all of the above certainty, illumination environment, and color of an object to calculate the final phase difference.

In the above formulas (12) to (18), the output values of the photodiodes 131-1 to 131-4 and the organic photoelectric conversion films 132-1 and 132-2 of the phase difference detection pixel are used as they are as PhotoDiode1 to PhotoDiode4 and Organic1 and Organic2; however, it is also possible to use these outputs to which a gain is applied by using a predetermined coefficient.

With the structure of the phase difference detection pixel illustrated in FIG. 10, phase difference detection can be performed using a difference in output between the plurality of photoelectric conversion layers, and optical loss can be made extremely small because a light-shielding film and a color filter are not provided. Thus, sufficient SNR can be obtained even under low illuminance and phase difference detection can be performed accurately.

In addition, when variation in manufacture occurs in the cross-sectional height direction in the phase difference detection pixel illustrated in FIG. 10, even if the output of any of the plurality of photoelectric conversion layers (e.g., the photodiodes 131-1 and 131-2) gets unreliable, the output of another photoelectric conversion layer can be used; therefore, robustness to variation in manufacture can be ensured.

Figure 11:
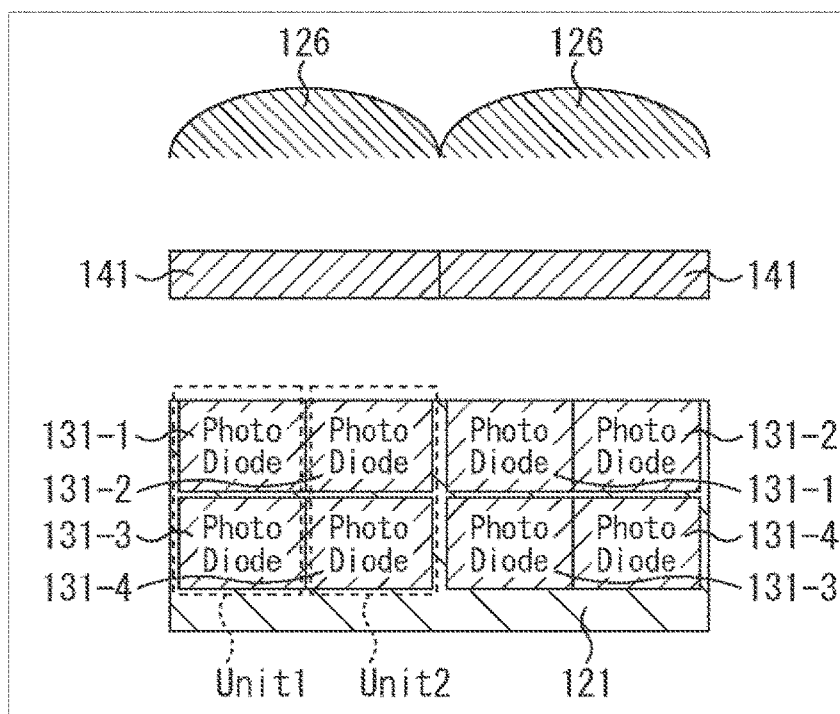
FIG. 11 is a cross-sectional view illustrating further another example structure of phase difference detection pixels.

Although the organic photoelectric conversion films are separately formed in the phase difference detection pixel illustrated in FIG. 10, an organic photoelectric conversion film 141 which is not separately formed may be used as illustrated in FIG. 11.

Figure 12:
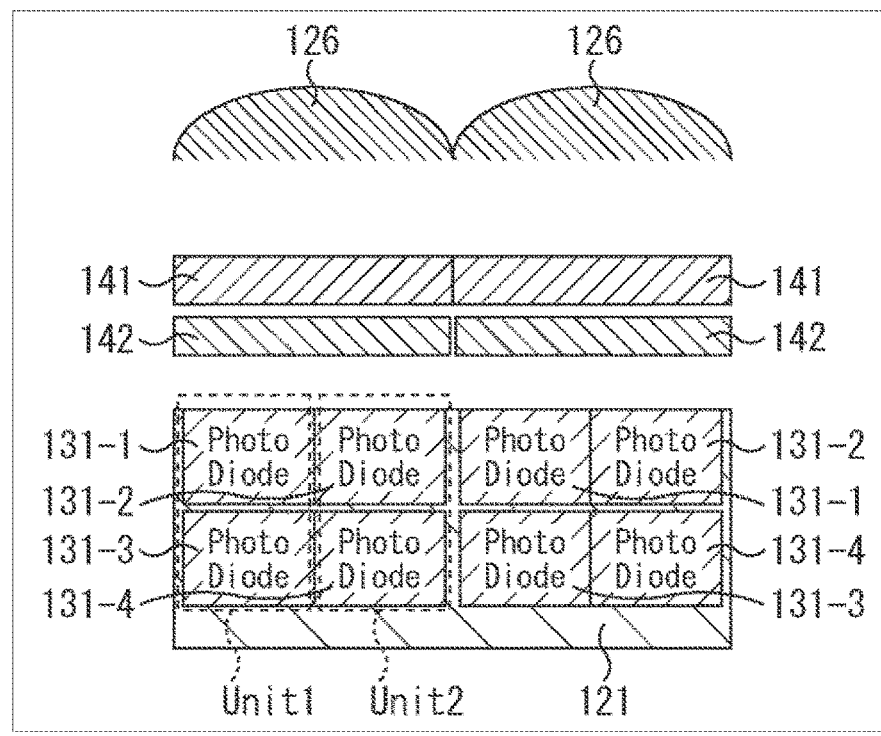
FIG. 12 is a cross-sectional view illustrating further another example structure of phase difference detection pixels.
Figure 13:
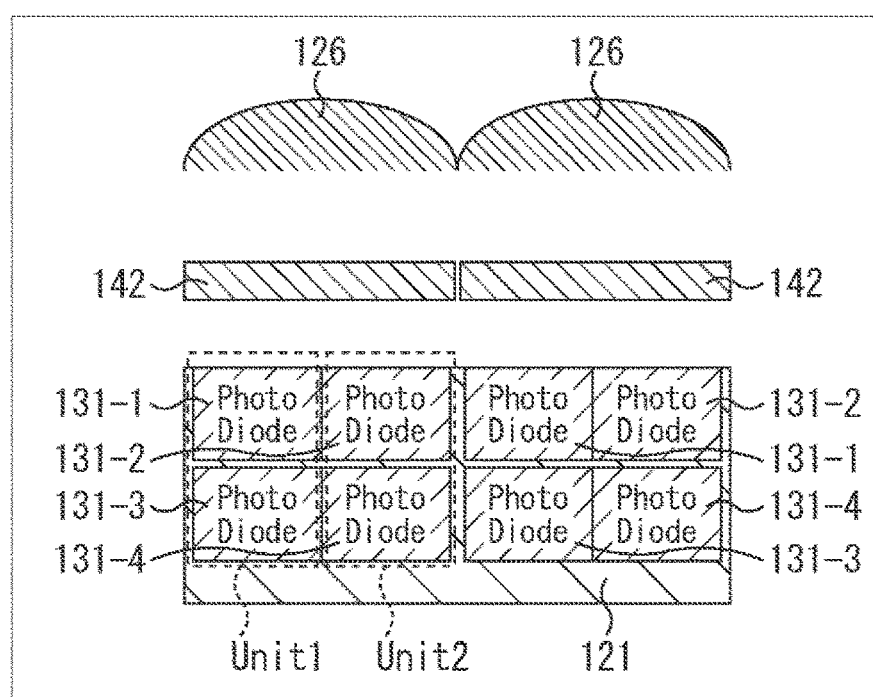
FIG. 13 is a cross-sectional view illustrating further another example structure of phase difference detection pixels.

Furthermore, in the structure illustrated in FIG. 11, when the spectral properties of the organic photoelectric conversion film 141 are insufficient, a color filter 142 may be provided below the organic photoelectric conversion film 141 as illustrated in FIG. 12. Alternatively, as illustrated in FIG. 13, the color filter 142 may be provided in place of the organic photoelectric conversion film 141.

In the above cases, phase difference detection processing is performed using a difference between the output of the unit 1 including the photodiodes 131-1 and 131-3 and the output of the unit 2 including the photodiodes 131-2 and 131-4.

The sum of the outputs of the unit 1 and the unit 2 in the above phase difference detection pixel is equal to the output of a normal imaging pixel. That is, the pixel structures illustrated in FIGS. 10 to 13 can also be applied to imaging pixels. Accordingly, the pixel structures illustrated in FIGS. 10 to 13 may be applied to all the pixels in the image sensor 103.

Further Another Example Structure of Phase Difference Detection Pixel

Figure 14:
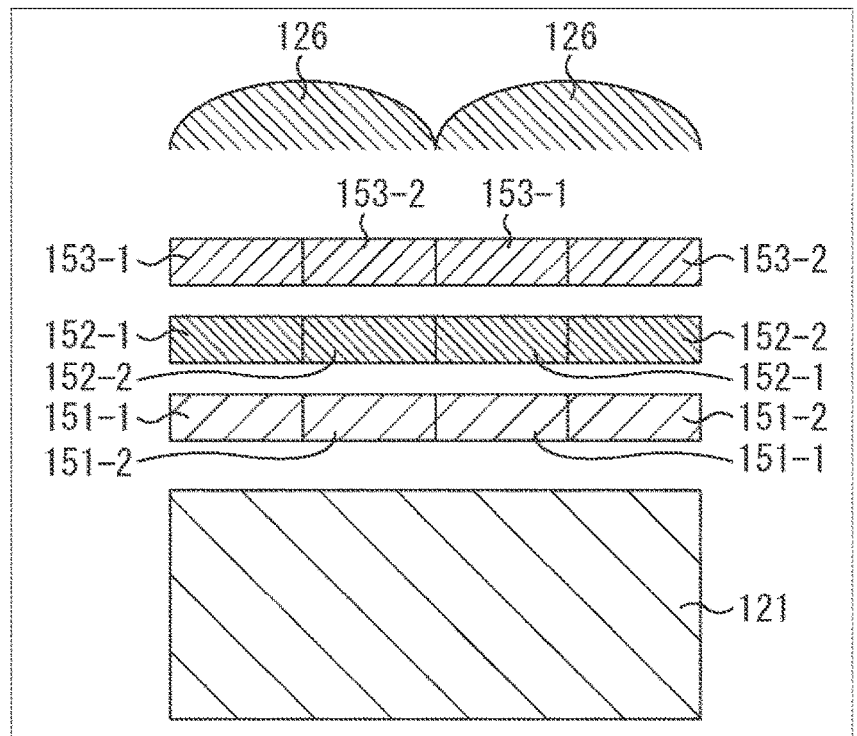
FIG. 14 is a cross-sectional view illustrating further another example structure of phase difference detection pixels.

FIG. 14 is a cross-sectional view illustrating further another example structure of phase difference detection pixels of the present technology.

In each of the phase difference detection pixels illustrated in FIG. 14, organic photoelectric conversion films 151-1 and 151-2 are formed above the semiconductor substrate 121. Organic photoelectric conversion films 152-1 and 152-2 are formed above the organic photoelectric conversion films 151-1 and 151-2. Organic photoelectric conversion films 153-1 and 153-2 are formed above the organic photoelectric conversion films 152-1 and 152-2. In addition, the on-chip lens 126 is formed above the organic photoelectric conversion films 153-1 and 153-2.

Each phase difference detection pixel illustrated in FIG. 14 is provided with one on-chip lens 126 and a plurality of photoelectric conversion layers formed below the on-chip lens 126, specifically, the organic photoelectric conversion films 153-1 and 153-2, the organic photoelectric conversion films 152-1 and 152-2, and the organic photoelectric conversion films 151-1 and 151-2 from the top. The organic photoelectric conversion films 153-1 and 153-2, the organic photoelectric conversion films 152-1 and 152-2, and the organic photoelectric conversion films 151-1 and 151-2 are separately formed with respect to the light-receiving surface in the respective layers.

In the phase difference detection pixel illustrated in FIG. 14, the photoelectric conversion layers, that is, the organic photoelectric conversion films 153-1 and 153-2 in the top layer, the organic photoelectric conversion films 152-1 and 152-2 in the second layer from the top, and the organic photoelectric conversion films 151-1 and 151-2 in the third layer from the top, photoelectrically convert light with the respective different wavelengths. For example, the organic photoelectric conversion films 153-1 and 153-2 photoelectrically convert green light, the organic photoelectric conversion films 152-1 and 152-2 photoelectrically convert blue light, and the organic photoelectric conversion films 151-1 and 151-2 photoelectrically convert red light.

Even in the case where the image sensor 103 includes phase difference detection pixels with the structure illustrated in FIG. 14, phase difference detection processing is performed in a manner similar to that with phase difference detection pixels with the structure illustrated in FIG. 10.

Figure 15:
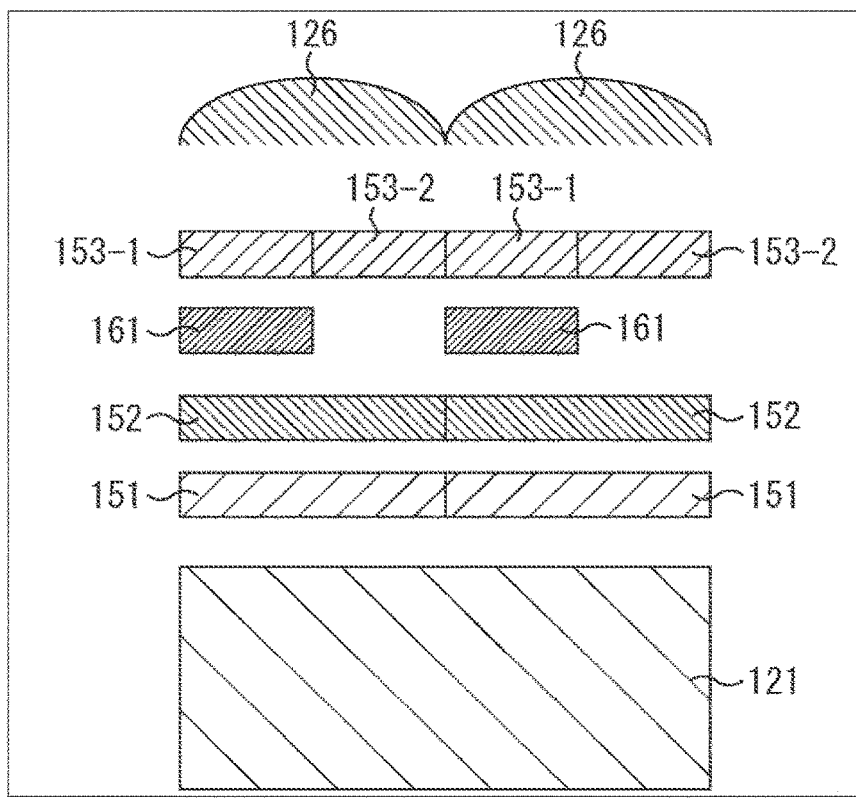
FIG. 15 is a cross-sectional view illustrating further another example structure of phase difference detection pixels.

Although the organic photoelectric conversion films are separately formed in all the three layers in the phase difference detection pixel illustrated in FIG. 14, it is also possible to separately form only the organic photoelectric conversion films 153-1 and 153-2 in the top layer and provide a light-shielding film 161 below the organic photoelectric conversion films 153-1 and 153-2 to partially block out light that enters organic photoelectric conversion films 151 and 152, which are below the light-shielding film 161, as illustrated in FIG. 15.

Figure 16:
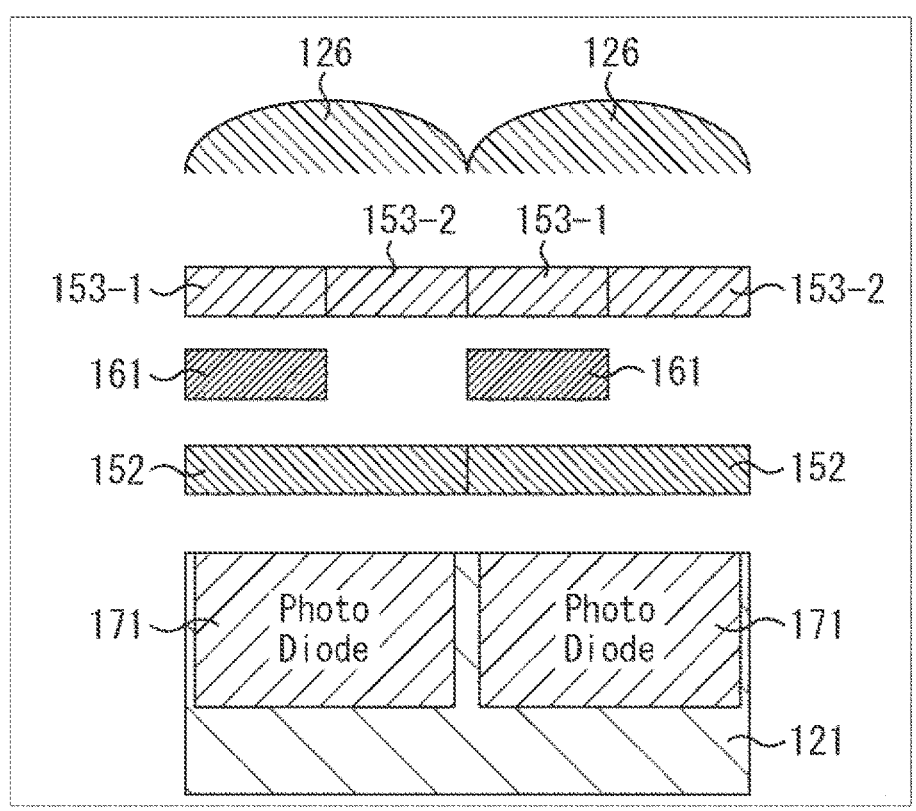
FIG. 16 is a cross-sectional view illustrating further another example structure of phase difference detection pixels.

Furthermore, as illustrated in FIG. 16, a photodiode 171 formed in the semiconductor substrate 121 may be provided in place of the organic photoelectric conversion film 151 in the bottom layer in the phase difference detection pixel illustrated in FIG. 15.

2. Second Embodiment

Configuration of Imaging Apparatus

Figure 17:
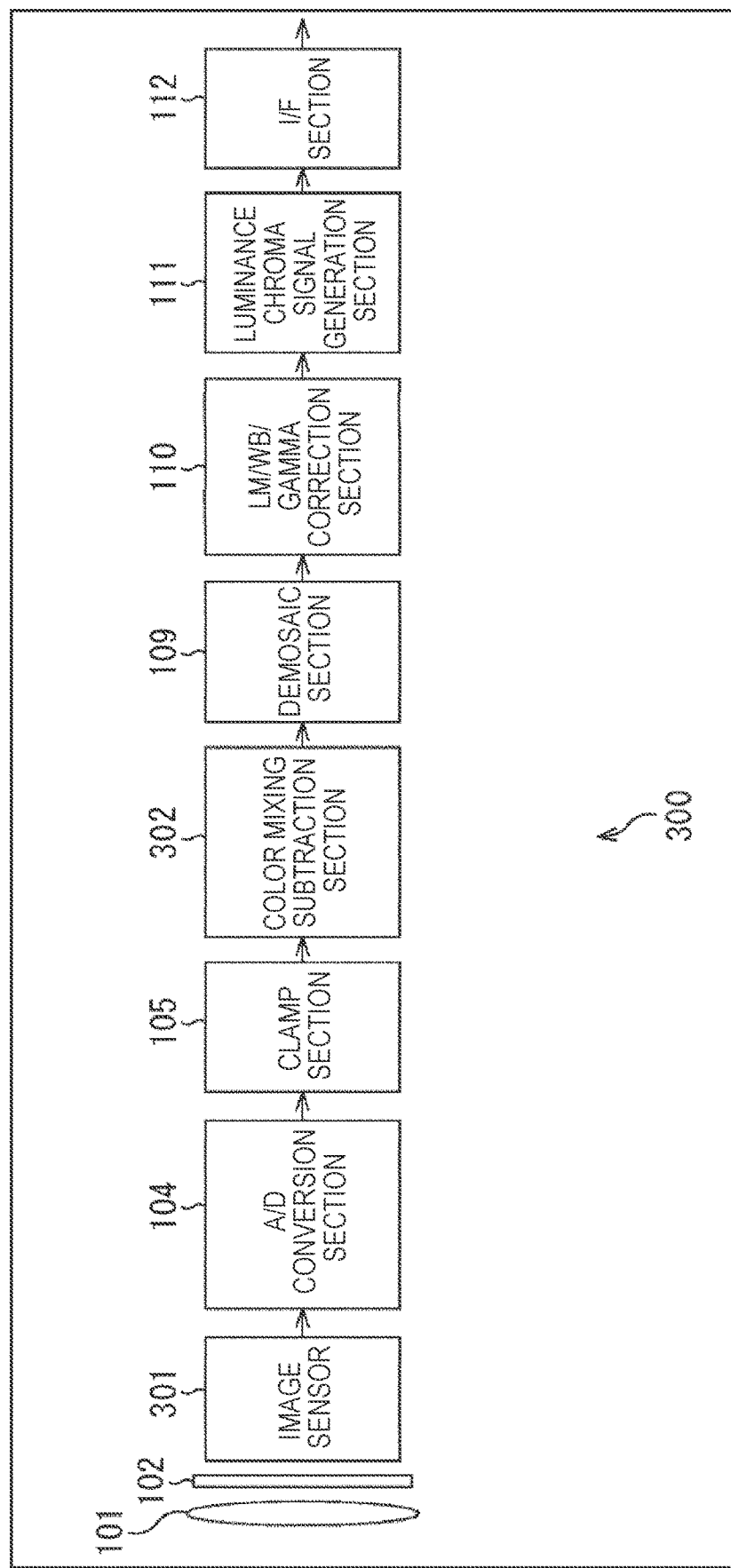
FIG. 17 is a block diagram illustrating an example configuration of an imaging apparatus of a second embodiment of the present technology.

FIG. 17 is a block diagram illustrating an example configuration of an imaging apparatus of a second embodiment of the present technology.

An imaging apparatus 300 illustrated in FIG. 17 includes the lens 101, the optical filter 102, an image sensor 301, the A/D conversion section 104, the clamp section 105, a color mixing subtraction section 302, the demosaic section 109, the LM/WB/gamma correction section 110, the luminance chroma signal generation section 111, and the I/F section 112.

Note that in the imaging apparatus 300 of FIG. 17, constituents having functions similar to those of the constituents provided in the imaging apparatus 100 of FIG. 1 are denoted by the same designations and the same numerals, and description of such constituents is omitted as appropriate.

In the image sensor 301, unlike in the image sensor 103 provided in the imaging apparatus 100 of FIG. 1, no phase difference detection pixels are arranged and only imaging pixels are arranged. In other words, the imaging apparatus 300 performs photographing processing without performing phase difference AF processing.

The color mixing subtraction section 302 subtracts a color mixing component, which is a light component having been transmitted through filters of peripheral pixels, from image data from the clamp section 105. The color mixing subtraction section 302 supplies the image data from which the color mixing component has been subtracted to the demosaic section 109.

Example Structure of Imaging Pixel

Figure 18:
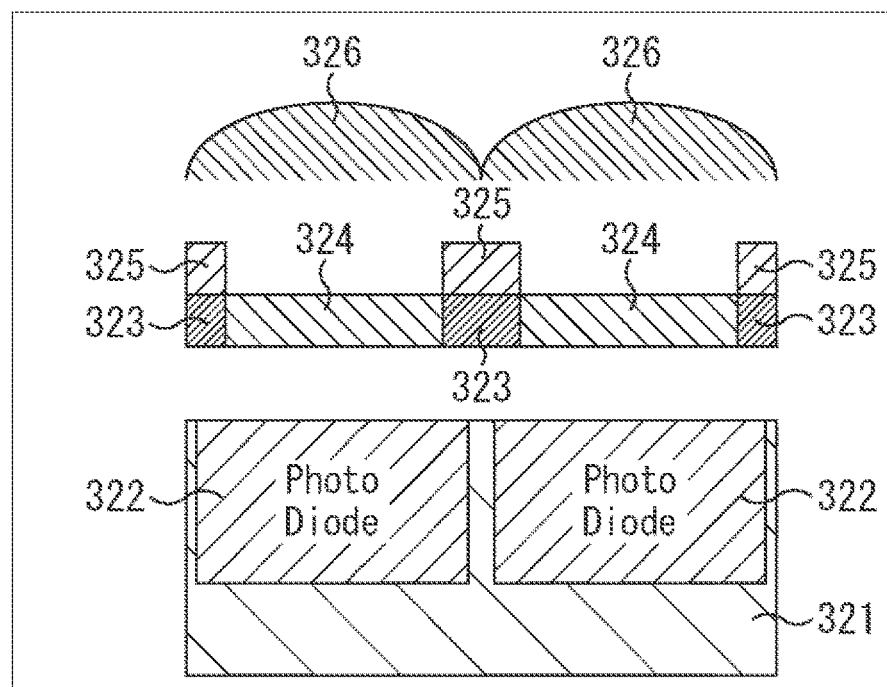
FIG. 18 is a cross-sectional view illustrating an example structure of imaging pixels of the present technology.

FIG. 18 is a cross-sectional view illustrating an example structure of imaging pixels of the present technology.

In each of the imaging pixels illustrated in FIG. 18, a photodiode 322 as a photoelectric conversion section is formed in a semiconductor substrate 321. Above the semiconductor substrate 321, a light-shielding film 323 and a color filter 324 are formed in the same layer, and above them, specifically, right above the light-shielding film 323, an organic photoelectric conversion film 325 is formed. In addition, an on-chip lens 326 is formed above the organic photoelectric conversion film 325.

Figure 19:
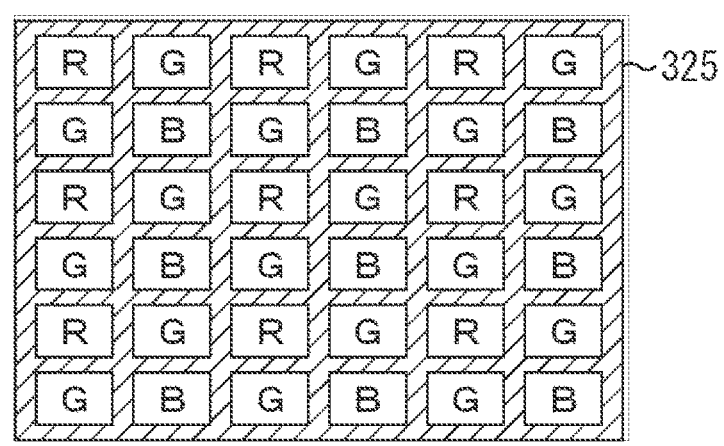
FIG. 19 illustrates an example configuration of an organic photoelectric conversion film.

Each imaging pixel illustrated in FIG. 18 is provided with one on-chip lens 326 and a plurality of photoelectric conversion layers formed below the on-chip lens 326, specifically, the organic photoelectric conversion film 325 and the photodiode 322 from the top. The organic photoelectric conversion film 325 is partially formed with respect to the light-receiving surface. Specifically, the organic photoelectric conversion film 325 is formed at the boundary part between adjacent imaging pixels as illustrated in FIG. 19. In addition, in the photodiode 322, the boundary part between adjacent imaging pixels is partially shielded from light by the light-shielding film 323.

Figure 20:
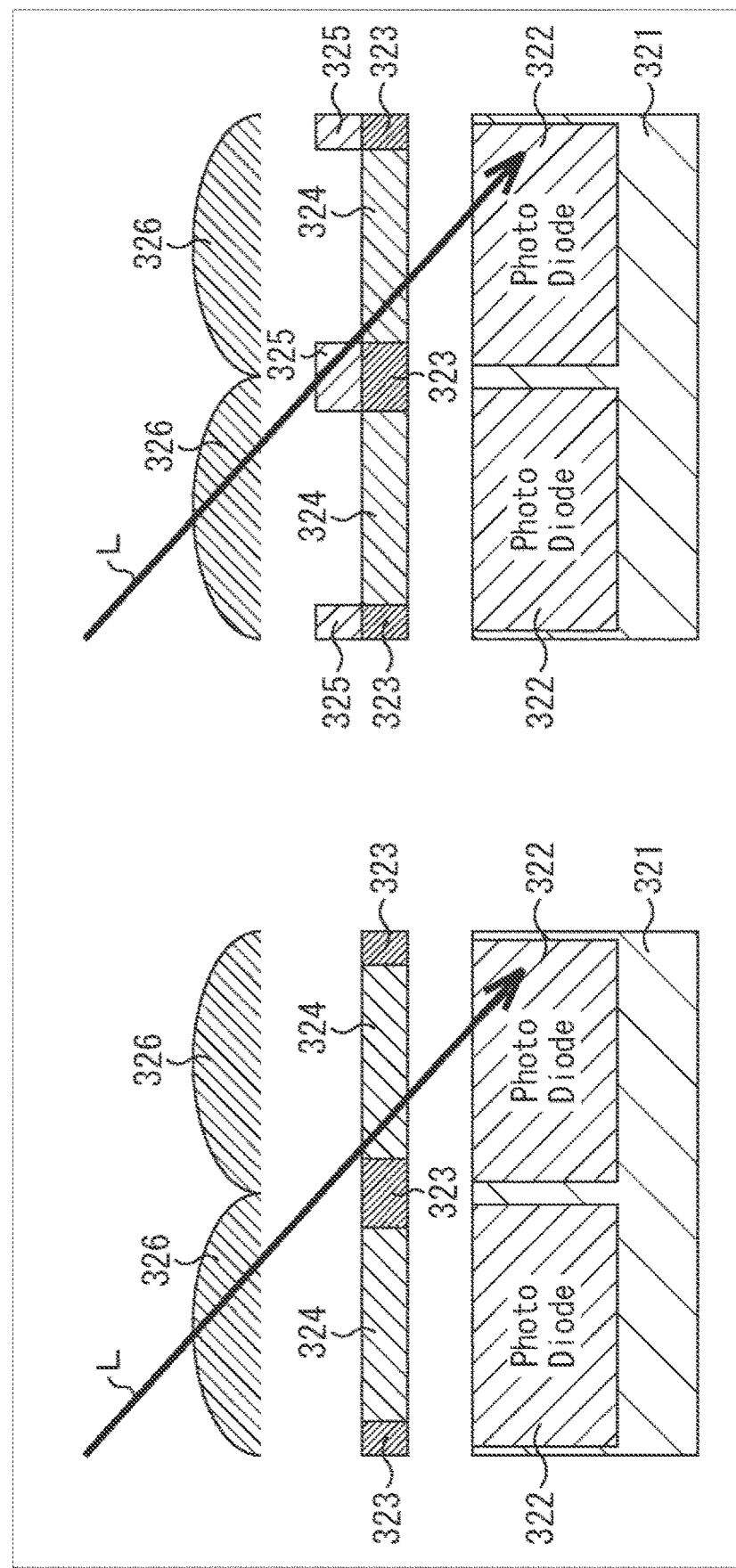
FIG. 20 is a view comparing conventional imaging pixels and imaging pixels of the present technology.

Next, referring to FIG. 20, a conventional imaging pixel and an imaging pixel of the present technology are compared in structure.

The conventional imaging pixel illustrated on the left side in FIG. 20 differs from the imaging pixel of the present technology illustrated on the right side in FIG. 20 in that the organic photoelectric conversion film 325 is not provided.

With the structure of the conventional imaging pixel, in the case where incident light L that has been transmitted through the on-chip lens 326 in the pixel on the left side enters the photodiode 322 in the pixel on the right side, the amount of light that has entered cannot be detected, which makes it difficult to correct a color mixing component with respect to the output of the pixel on the right side. This difficulty might adversely affect color reproducibility and SNR.

In contrast, with the structure of the imaging pixel of the present technology, in the case where incident light L that has been transmitted through the on-chip lens 326 in the pixel on the left side enters the photodiode 322 in the pixel on the right side, the amount of light that has entered can be estimated based on the output of the organic photoelectric conversion film 325, which makes it possible to correct a color mixing component with respect to the output of the pixel on the right side.

Imaging Processing

Next, imaging processing executed by the imaging apparatus 300 is described with reference to the flowchart in FIG. 21.

Figure 21:
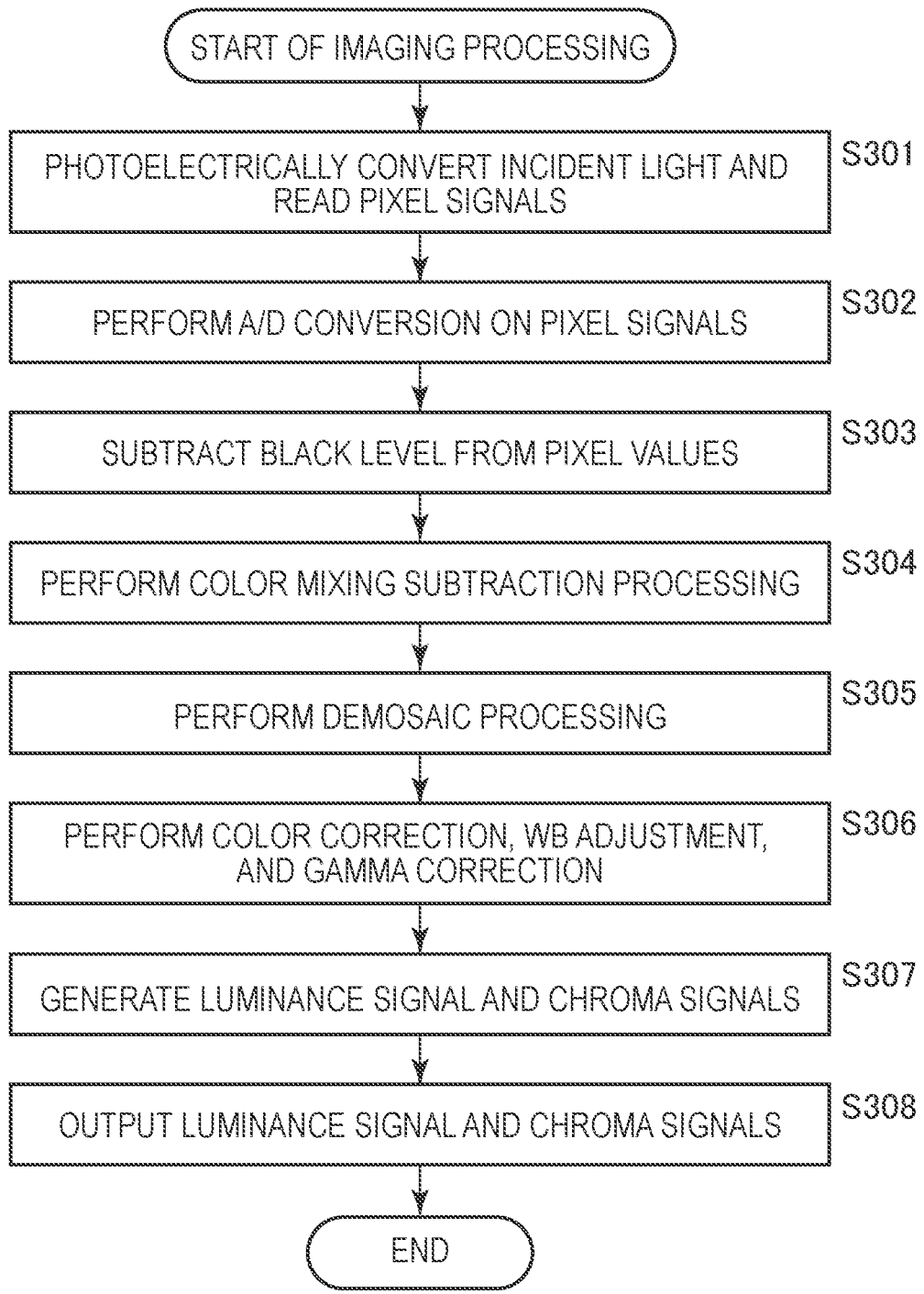
FIG. 21 is a flowchart for describing imaging processing.

The processing of steps S301 to S303 and S305 to S308 of the flowchart in FIG. 21 is the same as the processing of steps S201 to S203 and S205 to S208 of the flowchart in FIG. 6, and therefore is not repeatedly described. Note that in step S203, the clamp section 105 supplies the image data (pixel values) from which the black level has been subtracted for all the pixels to the color mixing subtraction section 302.

In step S304, the color mixing subtraction section 302 performs color mixing subtraction processing to subtract a color mixing component from image data from the clamp section 105, and supplies the resulting data to the demosaic section 109.

Specifically, the color mixing subtraction section 302 estimates the color mixing component by using the output of the organic photoelectric conversion film 325, and thereby calculates a pixel value $P_{Out}$ of the imaging pixel after color mixing correction based on the following formula (19).

Math. 19

$$P_{Out} = \text{PhotoDiode}_{Out} - (\alpha \times \text{Organic}_{Out}) \quad (19)$$

In the formula (19), $\text{PhotoDiode}_{Out}$ indicates the output of the photodiode 322, $\text{Organic}_{Out}$ indicates the output of the organic photoelectric conversion film 325, and a is a coefficient that is set arbitrarily. For example, the value of $\alpha$ may be adjusted depending on whether or not the pixel targeted for color mixing correction is close to an edge of the angle of view.

The pixel value $P_{Out}$ of the imaging pixel after color mixing correction is not limited to that calculated based on the formula (19), and may be calculated by application of another computation. For example, it is possible to perform a computation in accordance with the color of the pixel of interest targeted for color mixing correction, or perform a computation by using the output of the photodiode 322 of an imaging pixel adjacent to the pixel of interest in addition to the output of the organic photoelectric conversion film 325.

The image data from which the color mixing component has been subtracted in this manner is supplied to the demosaic section 109.

According to the above-described processing, in color mixing correction of the imaging pixel, the output corresponding to light resulting from color mixing can be estimated based on the output of the organic photoelectric conversion film 325, which makes it possible to correct a color mixing component with respect to the output of the pixel of interest, leading to improved image quality; thus, higher-quality images can be obtained.

Note that although the organic photoelectric conversion film 325 is described as being formed at the boundary part between the imaging pixels, the organic photoelectric conversion film 325 may be formed as one continuous film with respect to the effective pixel region, or may be formed every 2×2 pixels, for example. Furthermore, for example, the width of the organic photoelectric conversion film 325 at the boundary part between the imaging pixels, the position where the organic photoelectric conversion film 325 is formed, and the kind (material) of the organic photoelectric conversion film 325 may be changed in accordance with the kind of the color mixing component to be detected.

In conventional imaging apparatuses, the illumination environment (a light source such as a fluorescent lamp or a light bulb) at the time of imaging is estimated, and image creation is performed in accordance with the illumination environment. In recent years, however, new light sources such as light emitting diode (LED) light sources have spread. Under this circumstance, since only color signals of three colors can be obtained with an image sensor in which R, G, and B pixels are arranged in the Bayer array, it has become difficult to estimate the light source.

In view of this, an imaging apparatus capable of light source estimation with improved accuracy is described below.

3. Third Embodiment

Configuration of Imaging Apparatus

Figure 22:
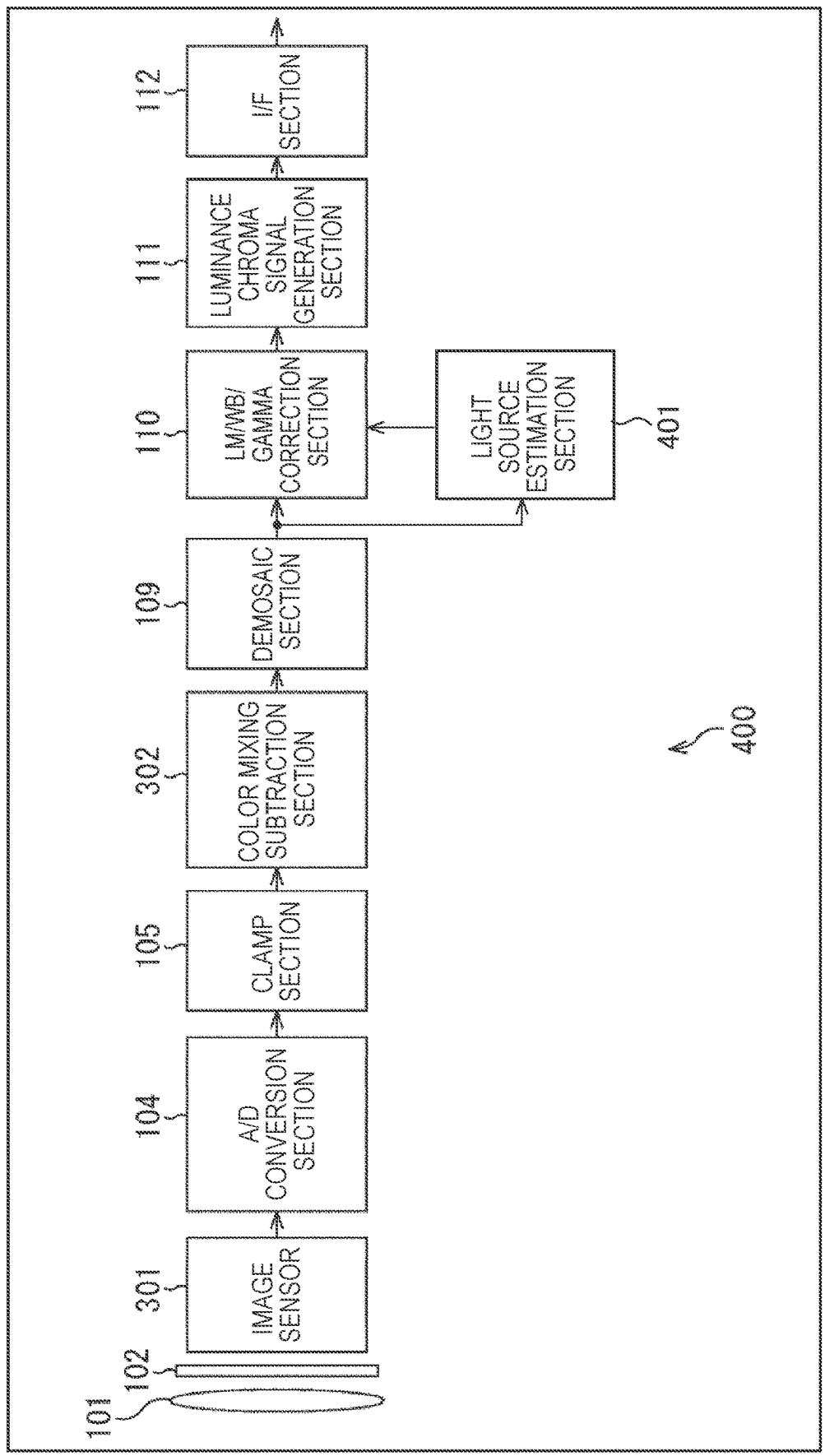
FIG. 22 is a block diagram illustrating an example configuration of an imaging apparatus of a third embodiment of the present technology.

FIG. 22 is a block diagram illustrating an example configuration of an imaging apparatus of a third embodiment of the present technology.

An imaging apparatus 400 illustrated in FIG. 22 includes the lens 101, the optical filter 102, the image sensor 301, the A/D conversion section 104, the clamp section 105, the color mixing subtraction section 302, the demosaic section 109, the LM/WB/gamma correction section 110, the luminance chroma signal generation section 111, the I/F section 112, and a light source estimation section 401.

Note that in the imaging apparatus 400 of FIG. 22, constituents having functions similar to those of the constituents provided in the imaging apparatus 300 of FIG. 17 are denoted by the same designations and the same numerals, and description of such constituents is omitted as appropriate.

The light source estimation section 401 estimates a light source illuminating an object from RGB data from the demosaic section 109, and supplies the estimation result to the LM/WB/gamma correction section 110.

Imaging Processing

Next, imaging processing executed by the imaging apparatus 400 is described with reference to the flowchart in FIG. 23.

Figure 23:
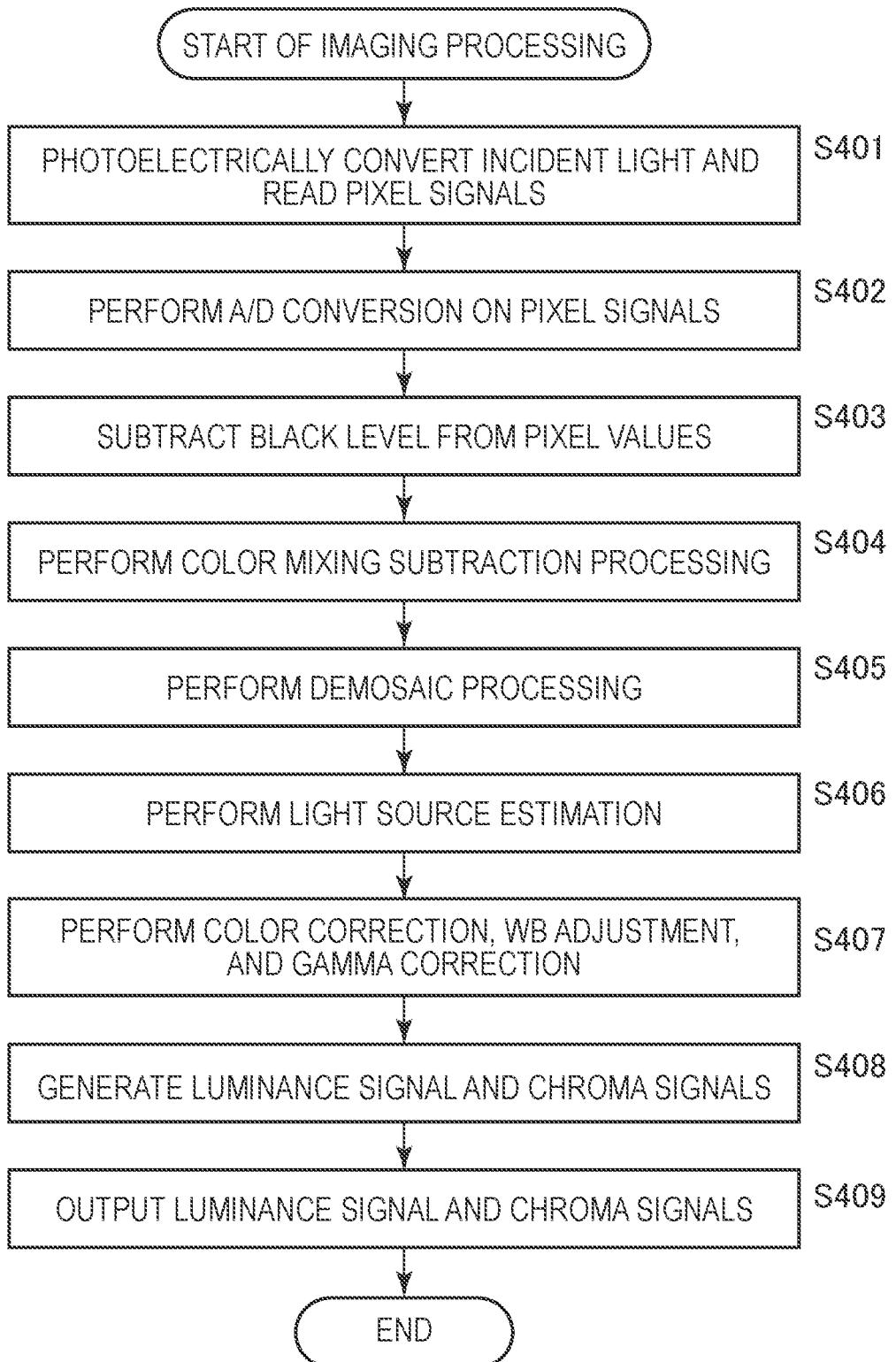
FIG. 23 is a flowchart for describing imaging processing.

The processing of steps S401 to S405, S408, and S409 of the flowchart in FIG. 23 is the same as the processing of steps S301 to S305, S307, and S308 of the flowchart in FIG. 21, and therefore is not repeatedly described. Note that in step S405, the demosaic section 109 supplies the image data (RGB data) after the demosaic processing also to the light source estimation section 401.

In step S406, the light source estimation section 401 performs light source estimation with respect to the RGB data from the demosaic section 109.

Specifically, the light source estimation section 401 performs light source estimation by using the output of the photodiode 322 and the output of the organic photoelectric conversion film 325 as the RGB data for each imaging pixel.

Conventionally, when light source estimation is performed by using the output ratios of R/G and B/G, for example, the output ratios of R/G and B/G do not always vary even if a light source A and a light source B with different spectral outputs are present. Specifically, the output of a pixel is not a value obtained for each wavelength but is an integral element determined by, for example, the product of the spectral properties of an image sensor and a light source; therefore, the light source cannot be determined when the output of each wavelength varies but the integral value is identical.

In contrast, in the light source estimation section 401, new spectral properties can be obtained in the organic photoelectric conversion film 325. Therefore, even if the output ratios of R/G and B/G are equivalent in the photodiode 322, for example, the spectral properties can be separated based on a difference in the output of the organic photoelectric conversion film 325, which results in improved accuracy of light source estimation. In particular, the configuration of the image sensor 301, which makes it possible to obtain the output from the organic photoelectric conversion film 325 without decreasing the number of pixels, improves the accuracy of light source estimation without lowering resolution.

The estimation result of the light source estimation performed in this manner is supplied to the LM/WB/gamma correction section 110.

In step S407, the LM/WB/gamma correction section 110 performs color correction, adjustment of white balance, and gamma correction on the RGB data from the demosaic section 109 based on the estimation result from the light source estimation section 401. Specifically, the LM/WB/gamma correction section 110 decides a matrix coefficient used for the color correction, sets a gain for adjusting the white balance, and decides a gamma curve used for the gamma correction by using the estimation result from the light source estimation section 401.

According to the above-described processing, light source estimation can be performed by using the output of the organic photoelectric conversion film 325 in addition to the output of the photodiode 322, which improves the accuracy of the light source estimation, leading to improved image quality; thus, higher-quality images can be obtained.

Figure 24:
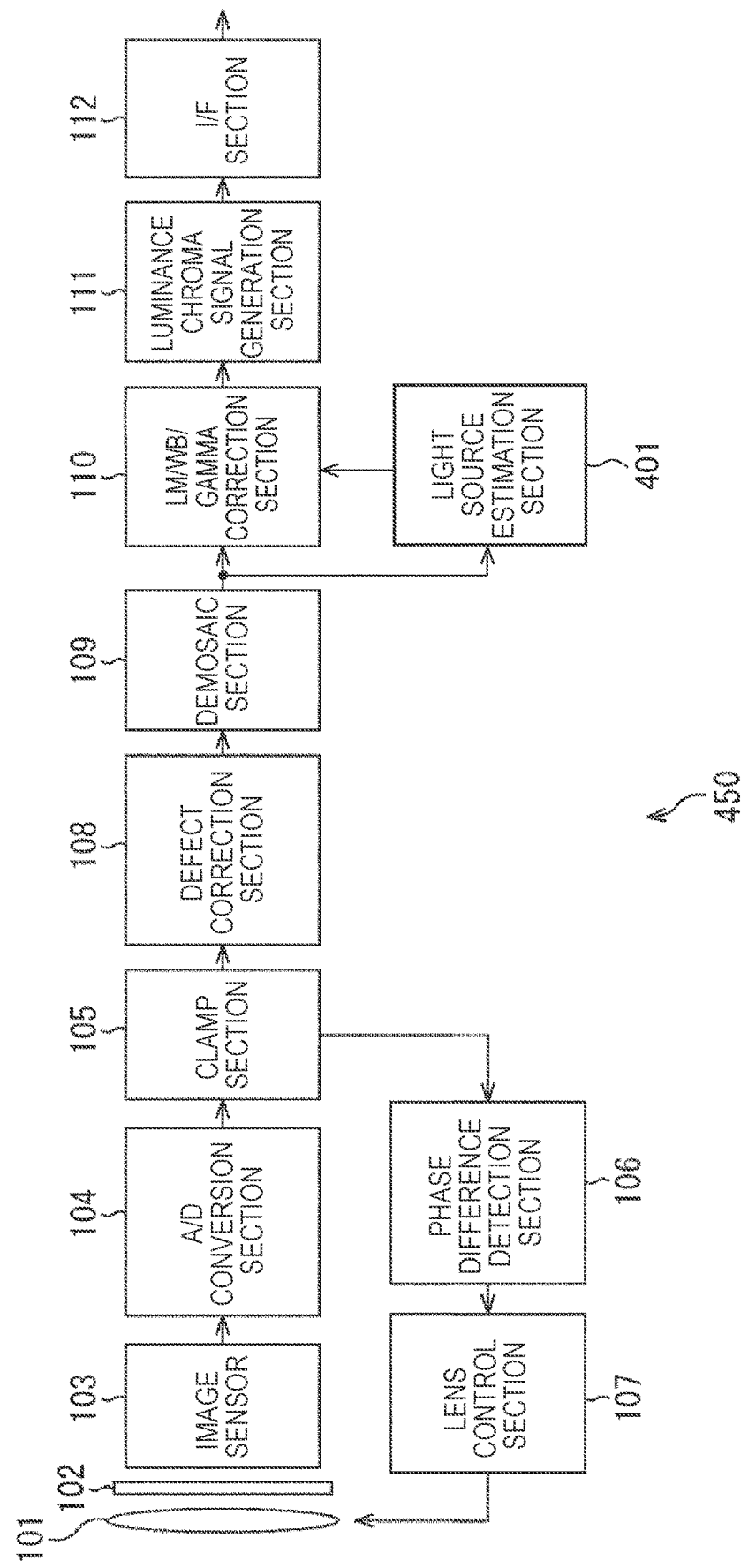
FIG. 24 is a block diagram illustrating another example configuration of an imaging apparatus.

As in an imaging apparatus 450 illustrated in FIG. 24, the light source estimation section 401 may be provided in the imaging apparatus 100 (FIG. 1), which performs phase difference detection. With this configuration, even if the normal imaging pixel is saturated and a correct RGB ratio cannot be obtained when an image of a bright object is captured, the phase difference detection pixel in which half of the photodiode is shielded from light is not saturated and a correct RGB ratio can be obtained. This configuration allows accurate light source estimation.

Furthermore, in this case, new spectral properties can be obtained in the organic photoelectric conversion film 125 in the phase difference detection pixel illustrated in FIG. 3, for example. Therefore, even if the output ratios of R/G and B/G are equivalent in the photodiode 122, the spectral properties can be separated based on a difference in the output of the organic photoelectric conversion film 125, which results in improved accuracy of light source estimation. Using the outputs of a plurality of photoelectric conversion layers with different spectral properties in this manner allows accurate light source estimation.

Figure 25:
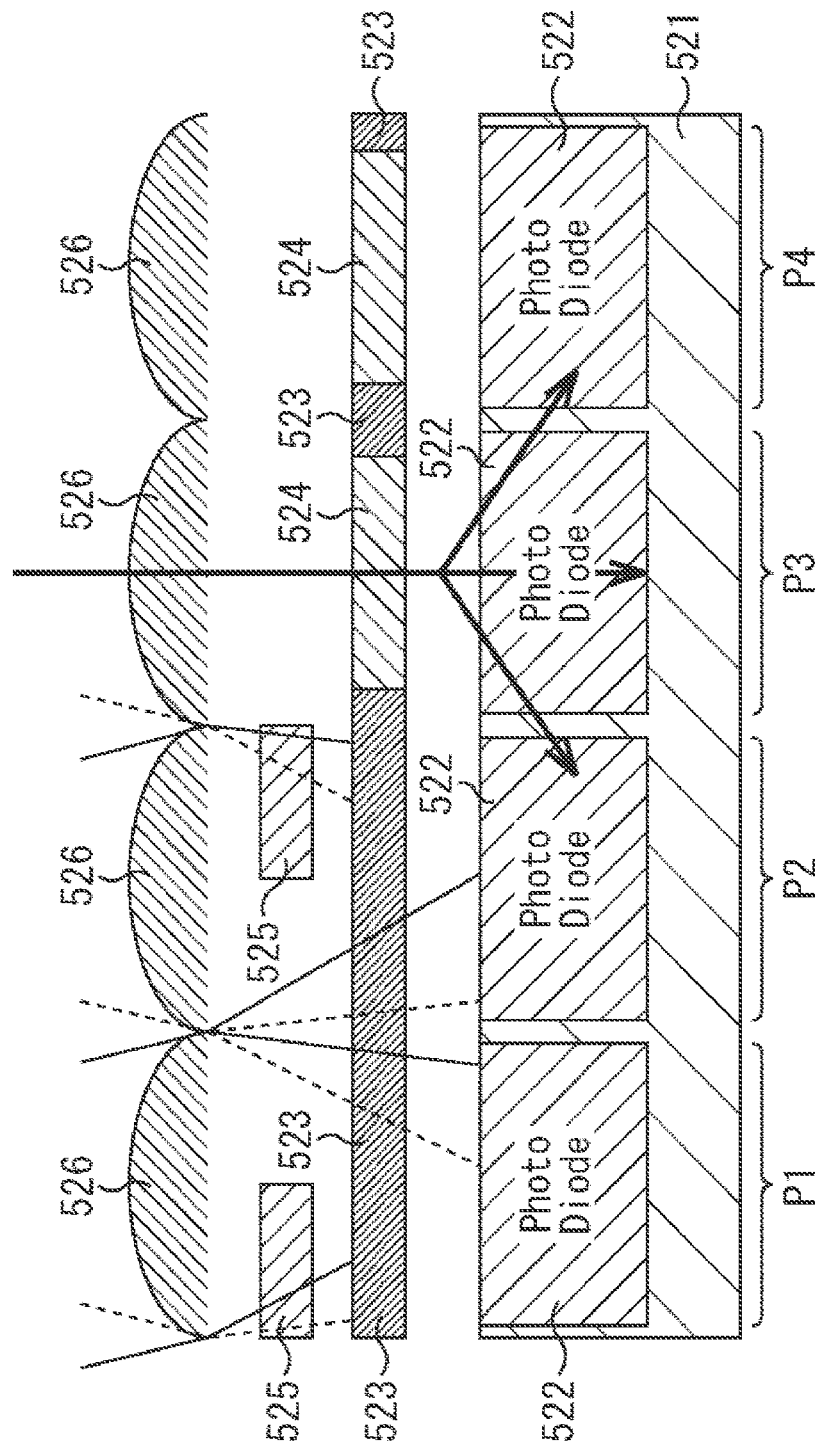
FIG. 25 is a cross-sectional view illustrating example structures of color mixing detection pixels and imaging pixels.

Pixels arranged in the image sensor 301 provided in an imaging apparatus that performs color mixing correction do not necessarily have the structure illustrated in FIG. 18, and may have the structure illustrated in FIG. 25, for example.

Another Example Structure of Imaging Pixel

FIG. 25 is a cross-sectional view illustrating another example structure of imaging pixels of the present technology.

FIG. 25 illustrates cross sections of color mixing detection pixels P1 and P2 for detecting color mixing and normal imaging pixels P3 and P4.

As illustrated in FIG. 25, in each of the color mixing detection pixels P1 and P2, a photodiode 522 as a photoelectric conversion section is formed in a semiconductor substrate 521. Above the semiconductor substrate 521, a light-shielding film 523 is formed, and an organic photoelectric conversion film 525 is partially formed above the light-shielding film 523. In addition, an on-chip lens 526 is formed above the organic photoelectric conversion film 525.

In each of the imaging pixels P3 and P4, the photodiode 522 as a photoelectric conversion section is formed in the semiconductor substrate 521. Above the semiconductor substrate 521, the light-shielding film 523 and a color filter 524 are formed in the same layer, and above them, the on-chip lens 526 is formed.

Each color mixing detection pixel illustrated in FIG. 25 is provided with one on-chip lens 526 and a plurality of photoelectric conversion layers formed below the on-chip lens 526, specifically, the organic photoelectric conversion film 525 and the photodiode 522 from the top. The organic photoelectric conversion film 525 is partially formed with respect to the light-receiving surface. The photodiode 522 is shielded from light by the light-shielding film 523 at the entire light-receiving surface.

However, as illustrated in FIG. 25, part of light that has entered the imaging pixel P3 proceeds into the photodiode 522 of the color mixing detection pixel P2. That is, the photodiode 522 of the color mixing detection pixel P2 can output only a color mixing component from the adjacent imaging pixel P3. Note that the photodiode 522 of the color mixing detection pixel P2 can be regarded as being partially shielded from light because it receives light from the adjacent imaging pixel P3.

In view of this, as in the technique disclosed in JP 2013-34086A, for example, the color mixing subtraction section 302 of the imaging apparatus 300 in FIG. 17 may estimate the amount of color mixing in the normal imaging pixel by using the output of the photodiode 522 of the color mixing detection pixel and subtract the estimated value from the output of the imaging pixel.

Alternatively, the color mixing detection pixels P1 and P2 illustrated in FIG. 25 may be provided in the image sensor 103 of the imaging apparatus 100 in FIG. 1 and phase difference detection may be performed by using a difference in output between the organic photoelectric conversion films 525 of the respective color mixing detection pixels P1 and P2.

Although the phase difference detection pixels are arranged to be distributed among the plurality of imaging pixels arranged two-dimensionally in a matrix form in the image sensor 103 in FIG. 1, all the pixels may be phase difference detection pixels. In that case, the imaging apparatus needs to be provided with separate image sensors for phase difference AF and imaging.

4. Fourth Embodiment

Configuration of Imaging Apparatus

Figure 26:
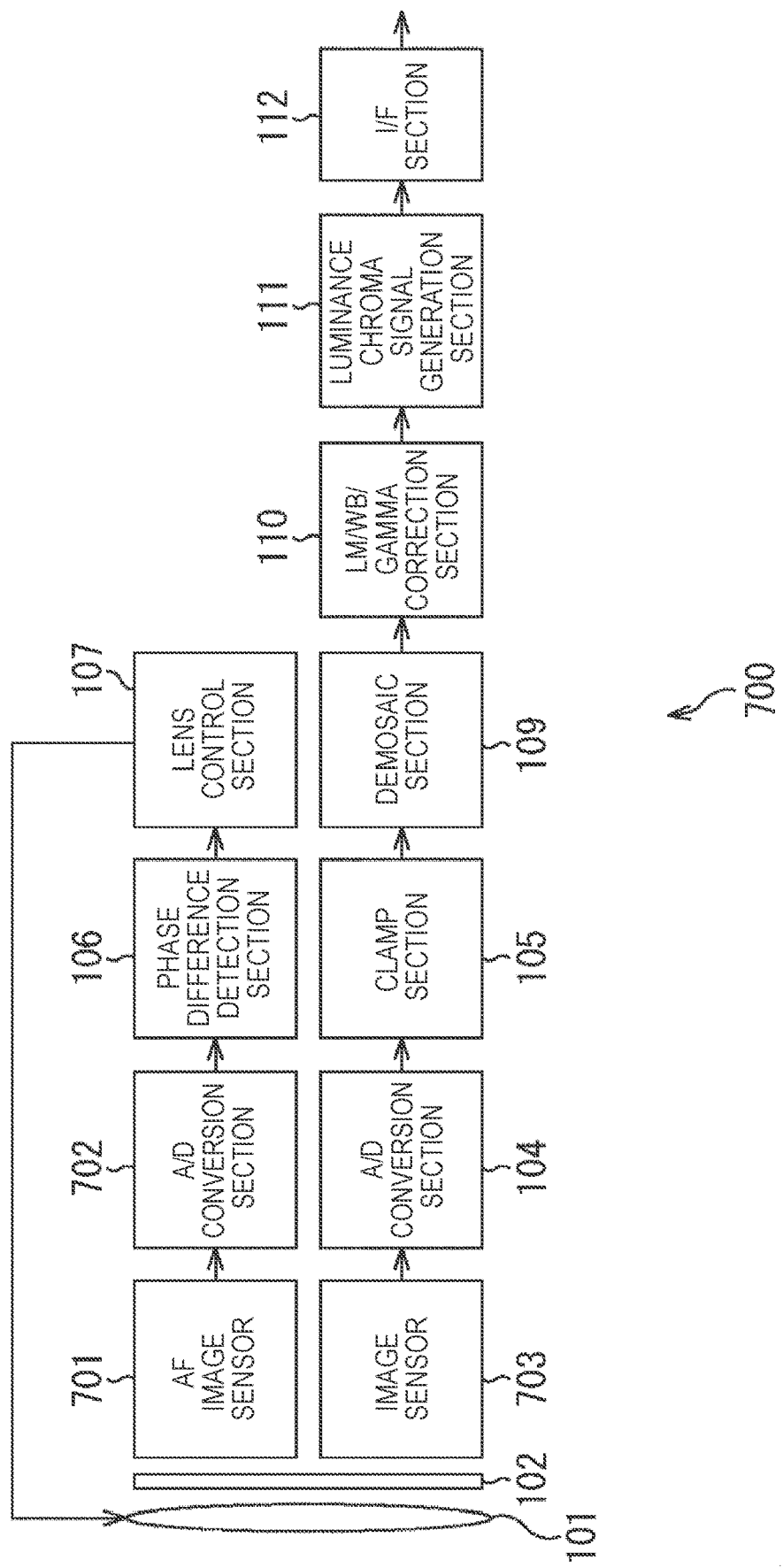
FIG. 26 is a block diagram illustrating an example configuration of an imaging apparatus of a fourth embodiment of the present technology.

FIG. 26 is a block diagram illustrating an example configuration of an imaging apparatus of a fourth embodiment of the present technology.

An imaging apparatus 700 illustrated in FIG. 26 includes the lens 101, the optical filter 102, an AF image sensor 701, an A/D conversion section 702, the phase difference detection section 106, the lens control section 107, an image sensor 703, the A/D conversion section 104, the clamp section 105, the demosaic section 109, the LM/WB/gamma correction section 110, the luminance chroma signal generation section 111, and the I/F section 112.

Note that in the imaging apparatus 700 of FIG. 26, constituents having functions similar to those of the constituents provided in the imaging apparatus 100 of FIG. 1 are denoted by the same designations and the same numerals, and description of such constituents is omitted as appropriate.

In the AF image sensor 701, unlike in the image sensor 103 provided in the imaging apparatus 100 of FIG. 1, no imaging pixels are arranged, and only the phase difference detection pixels illustrated in FIG. 3, for example, are arranged.

The A/D conversion section 702 converts electrical signals (analog signals) of RGB supplied from the AF image sensor 701 to digital data (image data) and supplies the digital data to the phase difference detection section 106.

In the image sensor 703, unlike in the image sensor 103 provided in the imaging apparatus 100 of FIG. 1, no phase difference detection pixels are arranged and only normal imaging pixels are arranged.

According to the above-described configuration, there is no need to provide phase difference detection pixels in the image sensor 703 used in normal imaging, which eliminates the need to perform defect correction on phase difference detection pixels. Furthermore, the AF image sensor 701 and the image sensor 703 can be manufactured as separate image sensors and thus can be manufactured by the respective optimized processes.

Alternatively, in the imaging apparatus 700 of FIG. 26, it is possible to provide the image sensor 301 in place of the image sensor 703 and provide the color mixing subtraction section 302 so that color mixing subtraction processing can be performed.

Furthermore, although the AF image sensor 701 is provided in the imaging apparatus 700 of FIG. 26, an image sensor for color mixing subtraction or an image sensor for light source estimation may be provided.

In the above embodiments, in the configuration in which one pixel includes an organic photoelectric conversion film and a photodiode, the organic photoelectric conversion film and the photodiode may have different exposure values (shutter/gain). For example, the frame rate of the photodiode is set to 30 fps and the frame rate of the organic photoelectric conversion film is set to 15 fps.

Even in the case where the frame rate of the organic photoelectric conversion film is lowered and accumulation time is increased in this manner, the normal output from the photodiode is not influenced.

In addition, in the above embodiments, the on-chip lens or the color filter of each pixel of the image sensor may be shrunk so that exit pupil correction can be performed. Thus, shading is corrected, which leads to improved sensitivity.

An image sensor of the present technology can be provided not only in the above-described imaging apparatuses but also in other electronic apparatuses having an imaging function.

Embodiments of the present technology are not limited to the above embodiments, and may assume various modifications within the scope of the present technology.

Additionally, the present technology may also be configured as below.
(1) An image sensor including a plurality of pixels, each pixel including
    one on-chip lens, and
    a plurality of photoelectric conversion layers formed below the on-chip lens,
    wherein each of at least two of the plurality of photoelectric conversion layers is split, partially formed, or partially shielded from light with respect to a light-receiving surface.
(2) The image sensor according to (1),
    wherein the pixels are phase difference detection pixels for performing auto focus (AF) by phase difference detection.
(3) The image sensor according to (2),
    wherein a difference in output between the photoelectric conversion layers in the plurality of phase difference detection pixels is used for the phase difference detection.
(4) The image sensor according to (2), further including:
    imaging pixels for generating an image,
    wherein the phase difference detection pixels are arranged to be distributed among the plurality of imaging pixels arranged two-dimensionally in a matrix form.
(5) The image sensor according to (4),
    wherein a difference in output between the photoelectric conversion layer in the phase difference detection pixel and the imaging pixel placed around the phase difference detection pixel is used for the phase difference detection.
(6) The image sensor according to any of (2) to (5),
    wherein the phase difference detection pixel includes
    an organic photoelectric conversion film partially formed as the top photoelectric conversion layer among the plurality of photoelectric conversion layers, and
    a photoelectric conversion section partially shielded from light as the photoelectric conversion layer formed in a substrate below the organic photoelectric conversion film.
(7) The image sensor according to (6),
    wherein the phase difference detection pixel further includes, below the organic photoelectric conversion film, a light-shielding film that partially shields the photoelectric conversion section from light, and
    wherein the organic photoelectric conversion film photoelectrically converts light partially blocked out by the light-shielding film.
(8) The image sensor according to (2),
    wherein the phase difference detection pixel includes, as the plurality of photoelectric conversion layers, at least two layers of photoelectric conversion sections formed in a substrate, each photoelectric conversion section being split.
(9) The image sensor according to (2),
    wherein the phase difference detection pixel includes, as the plurality of photoelectric conversion layers, at least two layers of organic photoelectric conversion films, each organic photoelectric conversion film being split or partially shielded from light.
(10) The image sensor according to (1),
    wherein the pixels are imaging pixels for generating an image.
(11) The image sensor according to (10),
    wherein the imaging pixel includes
    an organic photoelectric conversion film partially formed as the top photoelectric conversion layer among the plurality of photoelectric conversion layers, and
    a photoelectric conversion section partially shielded from light at a boundary part with another adjacent imaging pixel, as the photoelectric conversion layer formed in a substrate below the organic photoelectric conversion film, and
    wherein the organic photoelectric conversion film is formed at the boundary part with the other imaging pixel.
(12) The image sensor according to (1) to (11),
    wherein the phase difference detection pixel includes, as the plurality of photoelectric conversion layers, an organic photoelectric conversion film and a photoelectric conversion section that is formed in a substrate, and
    wherein the organic photoelectric conversion film and the photoelectric conversion section are controlled to have different exposure values.
(13) An electronic apparatus including:
    an image sensor including a plurality of pixels, each pixel including
    one on-chip lens, and
    a plurality of photoelectric conversion layers formed below the on-chip lens,
    wherein each of at least two of the plurality of photoelectric conversion layers is split, partially formed, or partially shielded from light with respect to a light-receiving surface; and
    a lens configured to cause object light to enter the image sensor.
(14) The electronic apparatus according to (13), further including:
    a phase difference detection section configured to perform phase difference detection by using a difference in output between the photoelectric conversion layers in the plurality of pixels; and
    a lens control section configured to control driving of the lens in accordance with a detected phase difference.
(15) The electronic apparatus according to (14),
    wherein the pixel includes
    an organic photoelectric conversion film partially formed as the top photoelectric conversion layer among the plurality of photoelectric conversion layers, and
    a photoelectric conversion section partially shielded from light as the photoelectric conversion layer formed in a substrate below the organic photoelectric conversion film.
(16) The electronic apparatus according to (15), further including:
    a defect correction section configured to correct, by using an output of the organic photoelectric conversion film, an output of the photoelectric conversion section as a pixel value for generating an image.

(17) The electronic apparatus according to (13),
wherein the pixel includes
an organic photoelectric conversion film partially formed as the top photoelectric conversion layer among the plurality of photoelectric conversion layers, and
a photoelectric conversion section partially shielded from light at a boundary part with another adjacent pixel, as the photoelectric conversion layer formed in a substrate below the organic photoelectric conversion film, and
wherein the organic photoelectric conversion film is formed at the boundary part with the other pixel.
(18) The electronic apparatus according to (17), further including:
a color mixing subtraction section configured to subtract, by using an output of the organic photoelectric conversion film, a color mixing component from an output of the photoelectric conversion section as a pixel value for generating an image.
(19) The electronic apparatus according to any of (13) to (18), further including:
a light source estimation section configured to estimate a light source of the object light by using outputs of the plurality of photoelectric conversion layers with different spectral properties.
(20) The electronic apparatus according to (19), further including:
a color property correction section configured to correct a color property of a pixel value, which is an output of the photoelectric conversion section, on the basis of an estimation result of the light source estimation section.

REFERENCE SIGNS LIST 100 imaging apparatus
101 lens
103 image sensor
106 phase difference detection section
107 lens control section
108 defect correction section
110 LM/WB/gamma correction section
122 photodiode
123 light-shielding film
125 organic photoelectric conversion film
300 imaging apparatus
301 image sensor
302 color mixing subtraction section
322 photodiode
323 light-shielding film
325 organic photoelectric conversion film
400 imaging apparatus
401 light source estimation section
450 imaging apparatus

The invention claimed is:

1. A light detecting device, comprising:
a semiconductor substrate;
a first on-chip lens disposed above the semiconductor substrate;
a second on-chip lens disposed above the semiconductor substrate;
a first photoelectric conversion portion disposed between the first on-chip lens and the semiconductor substrate;
a second photoelectric conversion portion disposed between the second on-chip lens and the semiconductor substrate;
a first color filter disposed above the semiconductor substrate and disposed below the first photoelectric conversion portion;
a second color filter disposed above the semiconductor substrate and disposed below the second photoelectric conversion portion;
a first photoelectric conversion region disposed in the semiconductor substrate and disposed below the first color filter; and
a second photoelectric conversion region disposed in the semiconductor substrate and disposed below the second color filter,
wherein the light detecting device is configured to detect a phase difference from a first output of the first photoelectric conversion portion and a second output of the second photoelectric conversion portion.

2. The light detecting device according to claim 1, wherein the first photoelectric conversion region is configured to photoelectrically convert light of a different color than that of the second photoelectric conversion region.

3. The light detecting device according to claim 1, wherein the first photoelectric conversion region is configured to receive light which passes through the first color filter and wherein the second photoelectric conversion region is configured to receive light which passes through the second color filter.

4. The light detecting device according to claim 1, wherein the first photoelectric conversion region is configured to photoelectrically convert light of a different color than that of the first photoelectric conversion portion and wherein the second photoelectric conversion region is configured to photoelectrically convert light of a different color than that of the second photoelectric conversion portion.

5. The light detecting device according to claim 1, further comprising:
a first light shield,
wherein at least a part of the first light shield being is at a same level as the first color filter in a cross-sectional view; and
a second light shield,
wherein at least a part of the second light shield being is at a same level as the second color filter in a cross-sectional view.

6. The light detecting device according to claim 5, wherein the first light shield and the second light shield comprise a metal.

7. The light detecting device according to claim 1, wherein the first on-chip lens corresponds to the first photoelectric conversion portion and the first photoelectric conversion region and wherein the second on-chip lens corresponds to the second photoelectric conversion portion and the second photoelectric conversion region.

8. The light detecting device according to claim 1, wherein the first photoelectric conversion portion and the second photoelectric conversion portion are configured to photoelectrically convert light of a same color.

9. The light detecting device according to claim 8, wherein the light is green light.

10. The light detecting device according to claim 8, wherein the light is blue light.

11. The light detecting device according to claim 8, wherein the light is red light.

12. The light detecting device according to claim 8, wherein the light is white light.

13. The light detecting device according to claim 8, wherein the light is infrared light.

14. The light detecting device according to claim 8, wherein the light is ultraviolet light.

15. A light detecting apparatus, comprising:
a lens; and
a light detecting device, comprising:
a semiconductor substrate;
a first on-chip lens disposed above the semiconductor substrate;
a second on-chip lens disposed above the semiconductor substrate;
a first photoelectric conversion portion disposed between the first on-chip lens and the semiconductor substrate;
a second photoelectric conversion portion disposed between the second on-chip lens and the semiconductor substrate;
a first color filter disposed above the semiconductor substrate and disposed below the first photoelectric conversion portion;
a second color filter disposed above the semiconductor substrate and disposed below the second photoelectric conversion portion;
a first photoelectric conversion region disposed in the semiconductor substrate and disposed below the first color filter; and
a second photoelectric conversion region disposed in the semiconductor substrate and disposed below the second color filter,
wherein the light detecting device is configured to detect a phase difference from a first output of the first photoelectric conversion portion and a second output of the second photoelectric conversion portion.

16. The light detecting apparatus according to claim 15, wherein the first photoelectric conversion region is configured to photoelectrically convert light of a different color than that of the second photoelectric conversion region.

17. The light detecting apparatus according to claim 15, wherein the first photoelectric conversion region is configured to receive light which passes through the first color filter and wherein the second photoelectric conversion region is configured to receive light which passes through the second color filter.

18. The light detecting apparatus according to claim 15, wherein the first photoelectric conversion region is configured to photoelectrically convert light of a different color than that of the first photoelectric conversion portion and wherein the second photoelectric conversion region is configured to photoelectrically convert light of a different color than that of the second photoelectric conversion portion.

19. The light detecting apparatus according to claim 15, further comprising:
a first light shield,
wherein at least a part of the first light shield is disposed at a same level as the first color filter in a cross-sectional view; and
a second light shield,
wherein at least a part of the second light shield is disposed at a same level as the second color filter in a cross-sectional view.

20. The light detecting apparatus according to claim 19, wherein the first light shield and the second light shield comprise a metal.

* * * * *